United States Patent
Takado et al.

(10) Patent No.: US 10,727,312 B2
(45) Date of Patent: *Jul. 28, 2020

(54) NITRIDE SEMICONDUCTOR DEVICE AND METHOD FOR MANUFACTURING THE SAME

(71) Applicant: ROHM CO., LTD., Kyoto (JP)

(72) Inventors: Shinya Takado, Kyoto (JP); Minoru Akutsu, Kyoto (JP); Taketoshi Tanaka, Kyoto (JP); Norikazu Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/421,219

(22) Filed: May 23, 2019

(65) Prior Publication Data

US 2019/0280101 A1    Sep. 12, 2019

Related U.S. Application Data

(63) Continuation of application No. 15/905,003, filed on Feb. 26, 2018, now Pat. No. 10,340,360, which is a
(Continued)

(30) Foreign Application Priority Data

Oct. 8, 2015    (JP) .................................. 2015-200415

(51) Int. Cl.
  *H01L 29/66*    (2006.01)
  *H01L 29/778*    (2006.01)
  (Continued)

(52) U.S. Cl.
  CPC .... *H01L 29/66462* (2013.01); *H01L 29/7786* (2013.01); *H01L 29/2003* (2013.01);
  (Continued)

(58) Field of Classification Search
  CPC ............. H01L 29/402; H01L 29/66462; H01L 29/7787; H01L 29/1066; H01L 29/2003
  See application file for complete search history.

(56) References Cited

U.S. PATENT DOCUMENTS 9,905,669 B2    2/2018 Takado et al.
2011/0006346 A1    1/2011 Ando et al.
(Continued)

FOREIGN PATENT DOCUMENTS

JP        2008072029 A    3/2008
JP        2011523218        8/2011
(Continued)

OTHER PUBLICATIONS

JP: Office Action of JP 2015-200415 (related application); dated Aug. 29, 2019; 12 pages.

*Primary Examiner* — Changhyun Yi
(74) *Attorney, Agent, or Firm* — Gregory M. Howison

(57) ABSTRACT

A nitride semiconductor device includes: an electron transit layer including $Ga_xIn_{1-x}N$ ($0<x\le1$); an electron supply layer formed on the electron transit layer and including $Al_yIn_{1-y}N$ ($0<y\le1$); a gate insulating film formed to pass through the electron supply layer to contact the electron transit layer; and a gate electrode facing the electron transit layer with the gate insulating film interposed therebetween, wherein, in the electron transit layer, a portion contacting the gate insulating film and a portion contacting the electron transit layer are flush with each other.

8 Claims, 19 Drawing Sheets

Related U.S. Application Data continuation of application No. 15/286,653, filed on Oct. 6, 2016, now Pat. No. 9,905,669.

(51) Int. Cl.
*H01L 29/423* (2006.01)
*H01L 29/51* (2006.01)
*H01L 29/20* (2006.01)

(52) U.S. Cl.
CPC .... *H01L 29/4236* (2013.01); *H01L 29/42364* (2013.01); *H01L 29/517* (2013.01)

(56) References Cited

U.S. PATENT DOCUMENTS

| | | | |
|---|---|---|---|
| 2012/0319165 A1* | 12/2012 | Nakayama | H01L 29/4236 257/190 |
| 2013/0056746 A1* | 3/2013 | Joshin | H01L 29/7781 257/76 |
| 2013/0320349 A1* | 12/2013 | Saunier | H01L 29/66462 257/76 |
| 2014/0061725 A1 | 3/2014 | Park et al. | |

FOREIGN PATENT DOCUMENTS

| | | | |
|---|---|---|---|
| JP | 2011233695 A | 11/2011 | |
| JP | 2013251544 A | 12/2013 | |
| JP | 2014222763 A | 11/2014 | |

\* cited by examiner

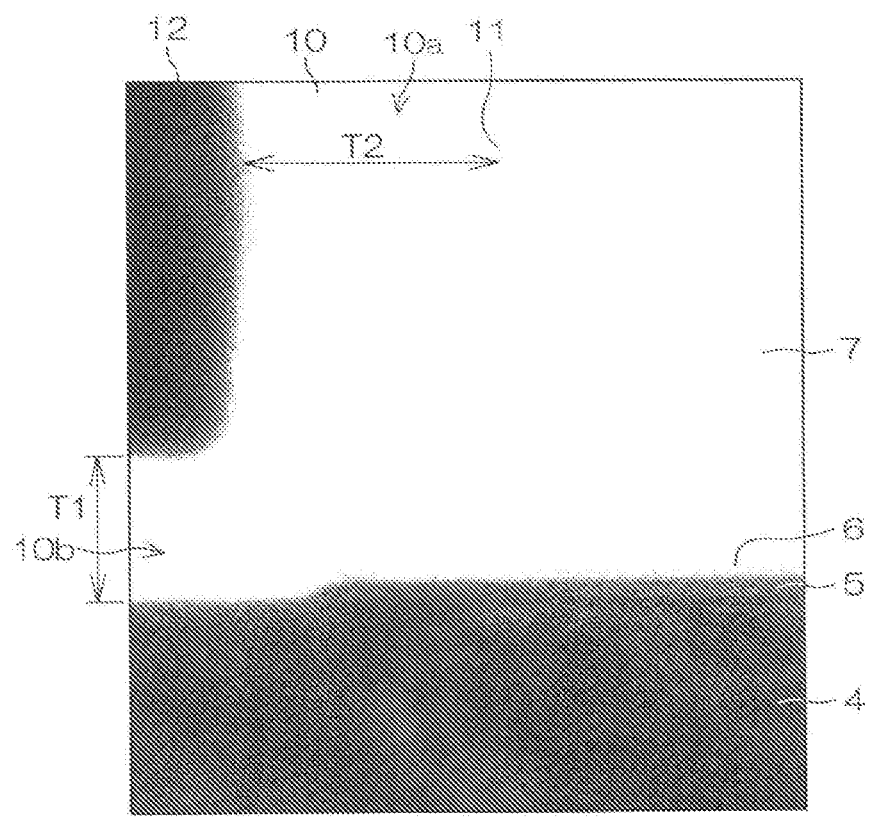

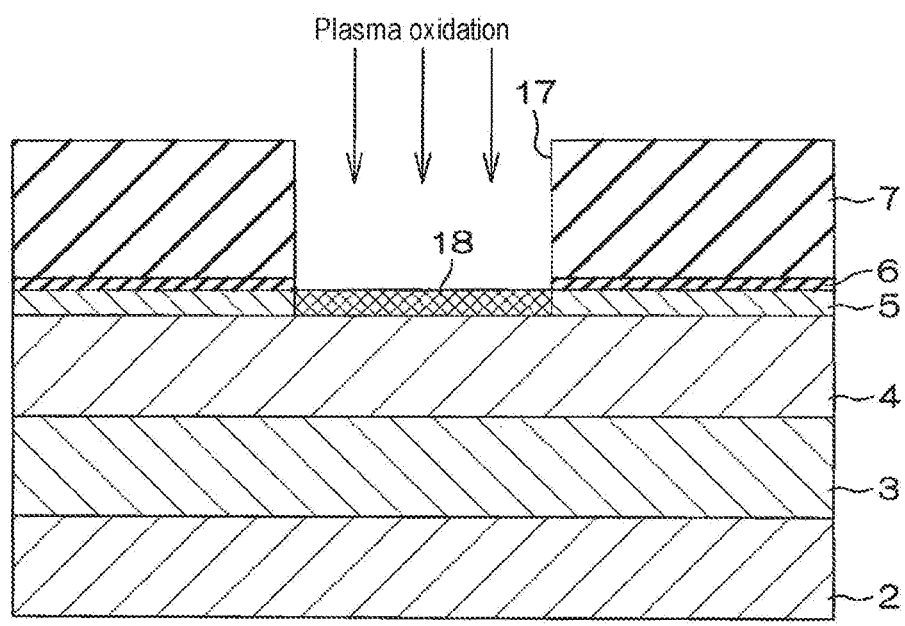
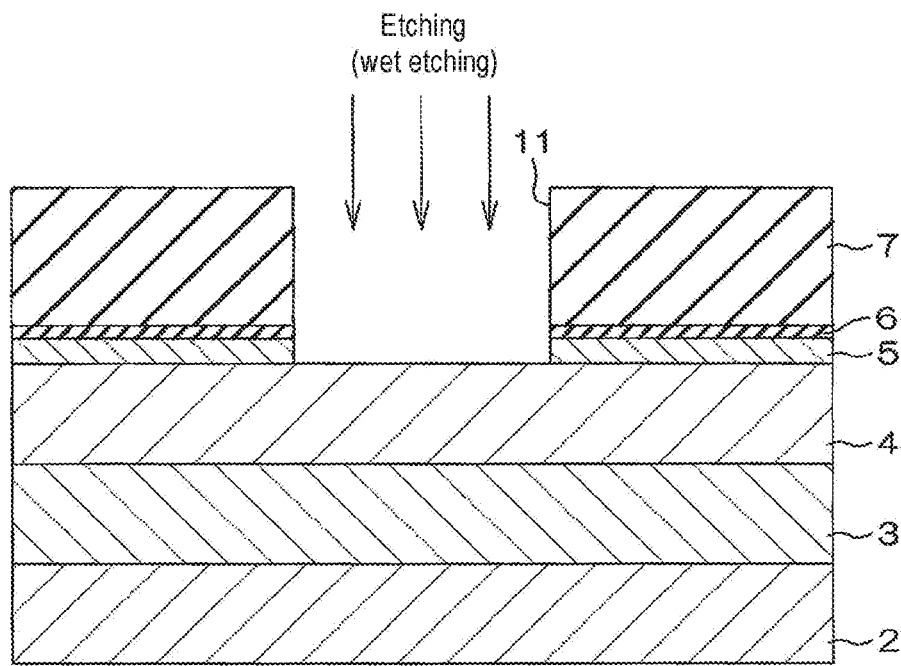

NITRIDE SEMICONDUCTOR DEVICE AND METHOD FOR MANUFACTURING THE SAME

CROSS-REFERENCE TO RELATED APPLICATIONS

This application is a continuation of U.S. patent application Ser. No. 15/905,003, filed Feb. 26, 2018, entitled NITRIDE SEMICONDUCTOR DEVICE AND METHOD FOR MANUFACTURING THE SAME, which is a Continuation of U.S. patent application Ser. No. 15/286,653, filed on Oct. 6, 2016 and issued as U.S. Pat. No. 9,905,669 on Feb. 27, 2018 which claims benefit of Japanese Application No. 2015-200415 the specifications of which are incorporated by reference herein in their entirety.

TECHNICAL FIELD

The present disclosure relates to a nitride semiconductor device and a method for manufacturing the same.

BACKGROUND

In the related art, a transistor is known which includes a buffer layer including GaN, a barrier layer including AlGaN formed on the buffer layer, a gate insulating film disposed in a trench formed in the barrier layer, and a gate electrode facing the buffer layer with the gate insulating film interposed therebetween.

In the transistor known in the related art, the trench is formed to penetrate through an electron supply layer in order to prevent 2DEG (Two Dimensional Electron Gas) from being formed immediately under the gate electrode when the gate electrode is turned off. No 2DEG is formed in a portion in which the trench is formed since there is no boundary between the electron supply layer and an electron transit layer. Thus, a normally-off operation is realized.

However, in the transistor known in the related art, the trench is formed to dig down a portion of the electron transit layer through the electron supply layer, and a portion of a region where 2DEG is to be formed when the gate electrode is turned on is lost. Therefore, an error occurs in a control voltage required to form the 2DEG, which may result in occurrence of a switching noise or increase in undesirable energy loss.

SUMMARY

The present disclosure provides some embodiments of a nitride semiconductor device which is capable of realizing a stable normally-off operation while preventing an electron transit layer from being damaged.

According to one embodiment of the present disclosure, there is provided a nitride semiconductor device including: an electron transit layer including $Ga_xIn_{1-x}N$ ($0<x\le1$); an electron supply layer formed on the electron transit layer and including $Al_yIn_{1-y}N$ ($0<y\le1$); a gate insulating film formed passing through the electron supply layer to contact the electron transit layer; and a gate electrode facing the electron transit layer with the gate insulating film interposed therebetween. In the electron transit layer, a portion contacting the gate insulating film and a portion contacting the electron transit layer are flush with each other.

With this configuration, in the electron transit layer, since a portion contacting the gate insulating film and a portion contacting the electron transit layer are flush with each other, it is possible to provide a nitride semiconductor device capable of realizing a good normally-off operation. The nitride semiconductor device having such characteristics is manufactured by a method including the following steps. A method for manufacturing a nitride semiconductor device, includes: forming an electron supply layer including $Al_yIn_{1-y}N$ ($0<y\le1$) on an electron transit layer including $Ga_xIn_{1-x}N$ ($0<x\le1$); and forming an oxide in a portion of the electron supply layer by selectively oxidizing the electron supply layer by a plasma oxidation method. The act of forming an oxide includes forming the electron transit layer such that a portion of the electron transit layer contacting the oxide and a portion of the electron transit layer contacting the electron supply layer are flush with each other.

With the above method, an oxide is formed in a portion of the electron supply layer by selectively oxidizing the electron supply layer by a plasma oxidation method. According to the plasma oxidation method, when the oxide is formed in the portion of the electron supply layer, since no or little oxygen in the atmosphere enters the electron transit layer, it is possible to form the oxide in the electron supply layer while avoiding oxidation of the electron transit layer. Thus, it is possible to form the electron transit layer in which a portion contacting the oxide and a portion contacting the electron supply layer are flush with each other while effectively preventing the electron transit layer from being damaged. As a result, it is possible to provide a nitride semiconductor device capable of realizing a good normally-off operation, and a method for manufacturing the same.

The method may further include, after the act of forming an oxide, removing the oxide by etching, and then forming a trench to expose the electron transit layer in the electron supply layer; forming a gate insulating film in the trench; and forming a gate electrode facing the electron transit layer with the gate insulating film interposed therebetween. With this method, since the oxide formed in the electron supply layer has the etching selectivity to the electron transit layer, it is possible to remove the oxide while preventing the electron transit layer from being etched. Thus, since it is possible to form the electron transit layer in which a portion contacting the gate insulating film and a portion contacting the electron supply layer are flush with each other, a good normally-off operation can be achieved.

The act of forming an oxide may also form a gate insulating film, and the method may further include, after the act of forming an oxide, forming a gate electrode facing the electron transit layer with the oxide interposed therebetween. With this method, the oxide can be, as it is, used as a portion of the gate insulating film. Thus, it is possible to form the electron transit layer in which a portion contacting the oxide as the portion of the gate insulating film and a portion contacting the electron supply layer are flush with each other.

The nitride semiconductor device may further include a trench formed in the electron supply layer to expose the electron transit layer. In this case, the gate insulating film may be formed in the trench. The nitride semiconductor device may further include a nonconductive spacer layer formed on the electron supply layer. In this case, the trench may be formed to expose the electron transit layer through the spacer layer and the electron supply layer.

In this configuration, the gate insulating film may be formed along the inner wall of the trench and the surface of the electron transit layer. In addition, in the gate insulating film, a portion formed along the inner wall of the trench may be thicker than a portion formed along the surface of the electron transit layer. With this configuration, it is possible to reduce electric capacity between the inner wall of the trench and the gate electrode. As a result, it is possible to suppress occurrence of a switching noise, thereby improving the switching characteristics.

In the nitride semiconductor device, the gate insulating film may include an oxide of the electron supply layer. The gate insulating film may include one or more insulating materials selected from a group consisting of $SiO_2$, $Al_2O_3$, AlON and SiN. The gate insulating film may be formed to have a thickness that causes an electric field in the gate insulating film to be equal to or less than 10 MV/cm.

According to another embodiment of the present disclosure, there is provided a nitride semiconductor device comprising: an electron transit layer; a first electron supply layer and a second electron supply layer which are sequentially formed on the electron transit layer in the order as they are written; a gate insulating film formed to be buried in the second electron supply layer such that the gate insulating film faces the first electron supply layer; and a gate electrode facing the electron transit layer with the gate insulating film and the first electron supply layer interposed therebetween. In this configuration, a conduction band energy level at an interface between the first electron supply layer immediately under the gate electrode and the electron transit layer may be larger than a Fermi energy level, and a conduction band energy level at an interface between the first electron supply layer, which does not lie immediately under the gate electrode, and the electron transit layer may be smaller than the Fermi energy level.

With this configuration, it is possible to provide a nitride semiconductor device capable of realizing a good normally-off operation. The nitride semiconductor device having such characteristics is manufactured by a method including the following steps. A method for manufacturing a nitride semiconductor device, includes: forming a first electron supply layer on an electron transit layer such that a conduction band energy level at an interface between the first electron supply layer and the electron transit layer becomes larger than a Fermi energy level; forming a second electron supply layer on the first electron supply layer such that a conduction band energy level at an interface between the electron transit layer and the first electron supply layer becomes smaller than the Fermi energy level; and forming an oxide on a portion of the second electron supply layer by selectively oxidizing the second electron supply layer, and causing the conduction band energy level at the interface between the first electron supply layer immediately under the oxide and the electron transit layer to be larger than the Fermi energy level.

With this method, since the electron transit layer is not exposed to the air after the first electron supply layer is formed, it is possible to effectively prevent the electron transit layer from being damaged due to oxidation or etching. Thus, it is possible to provide a nitride semiconductor device capable of realizing a stable normally-off operation, and a method for manufacturing the same. The method may further include, after the act of forming an oxide, removing the oxide by etching to form a trench having a bottom facing the first electron supply layer in the second electron supply layer; forming a gate insulating film in the trench; and forming a gate electrode facing the electron transit layer with the gate insulating film and the first electron supply layer interposed therebetween.

In the method, the act of forming an oxide may also form a gate insulating film. In this case, the method may further include, after the act of forming an oxide, forming a gate electrode facing the electron transit layer with the gate insulating film and the first electron supply layer interposed therebetween. In the nitride semiconductor device, the electron transit layer may include a nitride semiconductor, the first electron supply layer may include a nitride semiconductor having a lattice constant smaller than a lattice constant of the electron transit layer, and the second electron supply layer may include a nitride semiconductor having a lattice constant smaller than the lattice constant of the first electron supply layer.

In the nitride semiconductor device, the electron transit layer may include $Ga_xIn_{1-x}N$ ($0<x\leq1$), the first electron supply layer may include $Al_aGa_bIn_cN$ ($0\leq a\leq1$, $0\leq b\leq1$, $0\leq c\leq1$ and $a+b+c=1$), and the second electron supply layer may include $Al_yIn_{1-y}N$ ($0<y\leq1$). In the nitride semiconductor device, the first electron supply layer may have a stacked structure including a plurality of stacked nitride semiconductor layers made of $Al_aGa_bIn_cN$ ($0\leq a\leq1$, $0\leq b\leq1$, $0\leq c\leq1$ and $a+b+c=1$).

The nitride semiconductor device may further include a trench formed in the second electron supply layer. In this configuration, the gate insulating film may be formed in the trench. In the nitride semiconductor device, the gate insulating film may include an oxide of the second electron supply layer.

BRIEF DESCRIPTION OF THE DRAWINGS

FIG. 7 is a TEM image showing a portion of the nitride semiconductor device shown in FIG. 6.

FIG. 8C is a sectional view showing a step subsequent to the step shown in FIG. 8B.

FIG. 8D is a sectional view showing a step subsequent to the step shown in FIG. 8C.

DETAILED DESCRIPTION

Some reference examples and exemplary embodiments of the present disclosure will now be described in detail with reference to the accompanying drawings. Prior to description on the exemplary embodiments of the present disclosure, some reference examples will be described below.

First Reference Example

Figure 1:
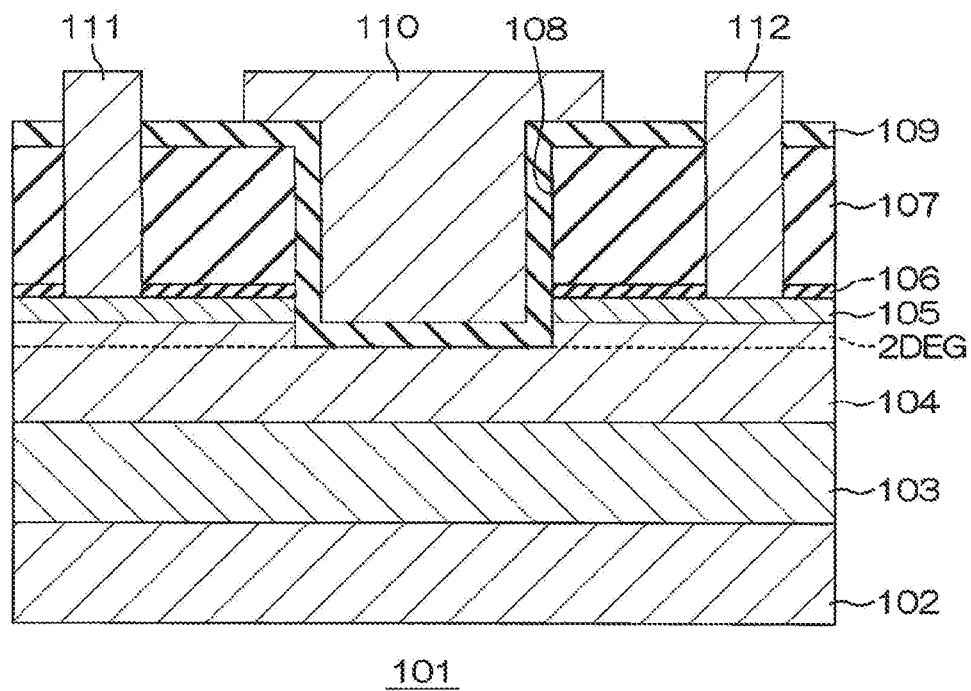
FIG. 1 is a sectional view showing a nitride semiconductor device according to a first reference example.

FIG. 1 is a sectional view showing a nitride semiconductor device 101 according to a first reference example. A nitride semiconductor device 101 is a high electron mobility transistor (HEMT) using a Group-III nitride semiconductor. The nitride semiconductor device 101 includes a substrate 102 on which a buffer layer 103, an electron transit layer 104, an electron supply layer 105, a passivation film 106 and a nonconductive spacer layer 107 are sequentially stacked in the order as they are written.

Both of the electron transit layer 104 and the electron supply layer 105 are made of $Al_xGa_yIn_zN$ ($0 \leq a \leq 1$, $0 \leq b \leq 1$, $0 \leq c \leq 1$ and $x+y+z=1$). In this example, the electron transit layer 104 is made of GaN and the electron supply layer 105 is made of AlGaN. The electron transit layer 104 and the electron supply layer 10 contain Ga and N in common. 2DEG (Two Dimensional Electron Gas) is formed in the vicinity of an interface in the electron transit layer 104 between the electron transit layer 104 and the electron supply layer 105 (e.g., at a distance of several A or so from the interface). The passivation film 106 is made of, e.g., SiN and the spacer layer 107 is made of, e.g., $SiO_2$.

A trench 108 to expose the electron transit layer 104 is formed in the electron supply layer 105. More specifically, the trench 108 is formed to dig down a surface portion of the electron transit layer 104 through the spacer layer 107, the passivation film 106 and the electron supply layer 105. A gate insulating film 109 is formed to extend along the inner wall of the trench 108. A concave space defined by the gate insulating film 109 is filled with a gate electrode 110.

Figure 2A:
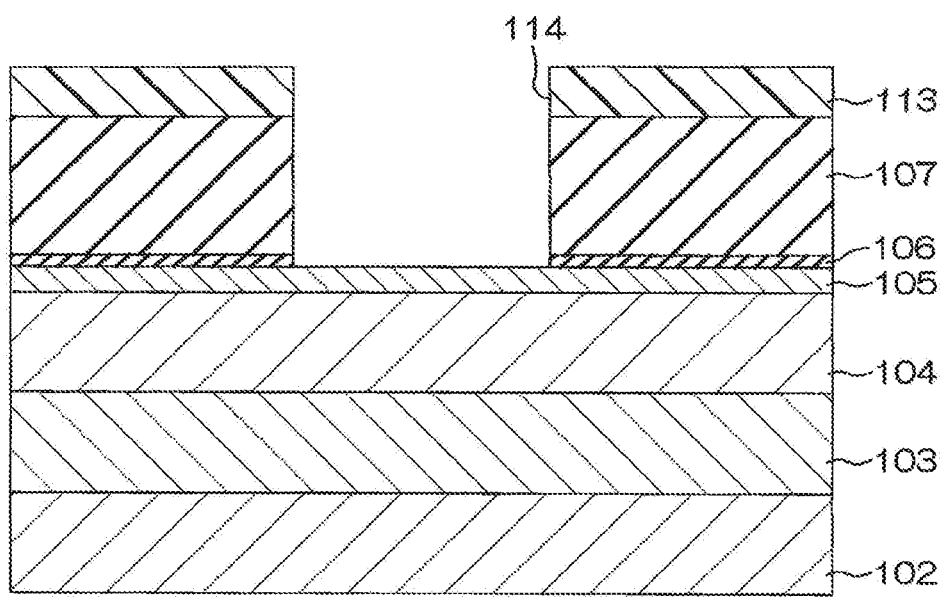
FIG. 2A is a sectional view showing a step in a process of manufacturing the nitride semiconductor device shown in FIG. 1.
Figure 2B:
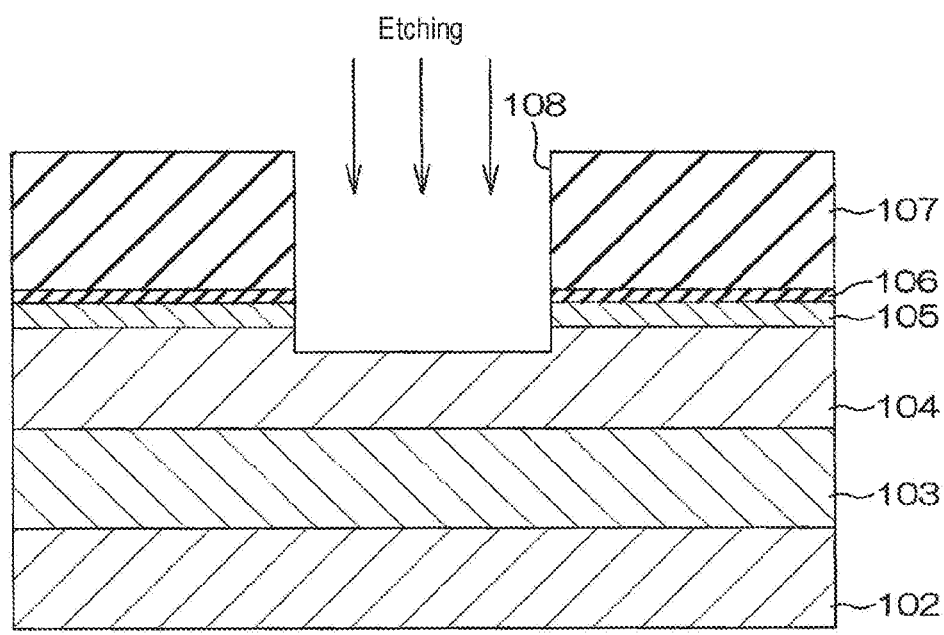
FIG. 2B is a sectional view showing a step subsequent to the step shown in FIG. 2A.

In addition, a source electrode 111 and a drain electrode 112 are formed with a space from the gate electrode 110. Both of the source electrode 111 and the drain electrode 112 are electrically connected to the electron supply layer 105 through the gate insulating film 109, the spacer layer 107 and the passivation film 106. FIGS. 2A and 2B are sectional views showing steps in a process of manufacturing the nitride semiconductor device 101 shown in FIG. 1.

In order to manufacture the nitride semiconductor device 101, the buffer layer 103, the electron transit layer 104, the electron supply layer 105, the passivation film 106 and the nonconductive spacer layer 107 are sequentially stacked on the substrate 102 in the order as they are written by means of, e.g., a CVD method or the like, as shown in FIG. 2A. Next, a mask 113 having an opening 114 selectively in a region in which the trench 108 is to be formed is formed on the spacer layer 107. Next, the spacer layer 107 and the passivation film 106 are partially removed by means of dry etching or wet etching using the mask 113 as a mask.

Next, as shown in FIG. 2B, an unnecessary portion of the electron supply layer 105 is removed by means of dry etching or wet etching. Thus, the trench 108 is formed. In this step, since etching selectivity of the electron transit layer 104 and the electron supply layer 105 is small, a surface portion of the electron transit layer 104 is etched (over-etched) along with the electron supply layer 105. Thereafter, the gate insulating film 109, the gate electrode 110, the drain electrode 112 and the source electrode 111 are formed. Thus, the nitride semiconductor device 101 is manufactured.

In the nitride semiconductor device 101, the trench 108 is formed to penetrate through the electron supply layer 105 in order to prevent 2 DEF from being formed immediately under the gate electrode 110 when the gate electrode 110 is turned off. No 2DEG is formed in a portion in which the trench 108 is formed since there is no boundary between the electron supply layer 105 and the electron transit layer 104. Thus, a normally-off operation is realized.

However, the trench 108 is formed to dig down a portion of the electron transit layer 104 through the electron supply layer 105, and a portion of a region where 2DEG is to be formed when the gate electrode 110 is turned on is lost. Therefore, an error occurs in a control voltage required to form the 2DEG, which may result in an occurrence of a switching noise or increase in an undesirable energy loss.

Since etching selectivity of the electron transit layer 104 (GaN) and the electron supply layer 105 (AlGaN) is small, such as a trench 108 is formed as the electron transit layer 104 is etched (over-etched) along with the electron supply layer 105. Therefore, by shortening an etching time for the electron supply layer 105, it is considered that it is possible to prevent the electron transit layer 104 from being damaged. A structure for achieving this configuration is shown, as a nitride semiconductor device 115 according to a second reference example, in FIG. 3.

Second Reference Example

Figure 3:
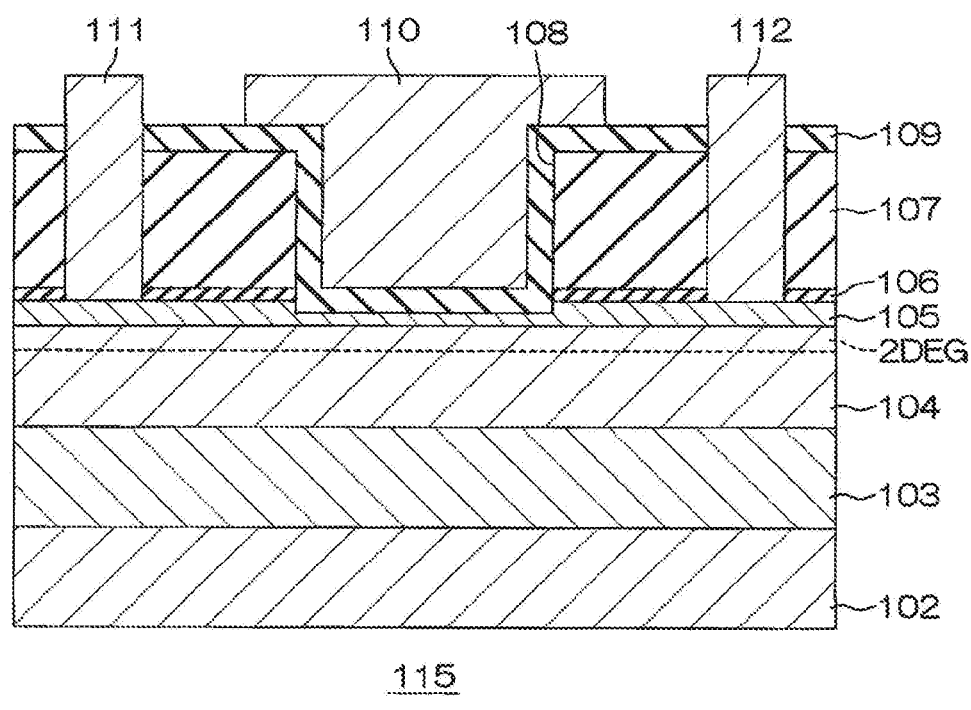
FIG. 3 is a sectional view showing a nitride semiconductor device according to a second reference example.

FIG. 3 is a sectional view showing a nitride semiconductor device 115 according to a second reference example.

The nitride semiconductor device 115 is different from the above-described nitride semiconductor device 101 in that a portion of the electron supply layer 105 is interposed between the gate electrode 110 and the electron transit layer 104. However, the nitride semiconductor device 115 has the same configuration in other aspects as the above-described nitride semiconductor device 101 and therefore, an explanation of which will not be repeated. In the electron transit layer 104 (GaN) and the electron supply layer 105 (AlGaN) having relatively small etching selectivity, since it is very difficult to control an etching degree of the electron supply layer 105, the electron supply layer 105 cannot help partially remaining in order to avoid over-etching the electron transit layer 104. This results in an unstable normally-off operation due to the partial interposition of the electron supply layer 105 between the gate electrode 110 and the electron transit layer 104, as shown in FIG. 3. As a third reference example, a nitride semiconductor device 116 manufactured by a manufacturing method different from those of the nitride semiconductor devices 101 and 115 according the first and second reference examples is shown in FIG. 4.

Third Reference Example

Figure 4:
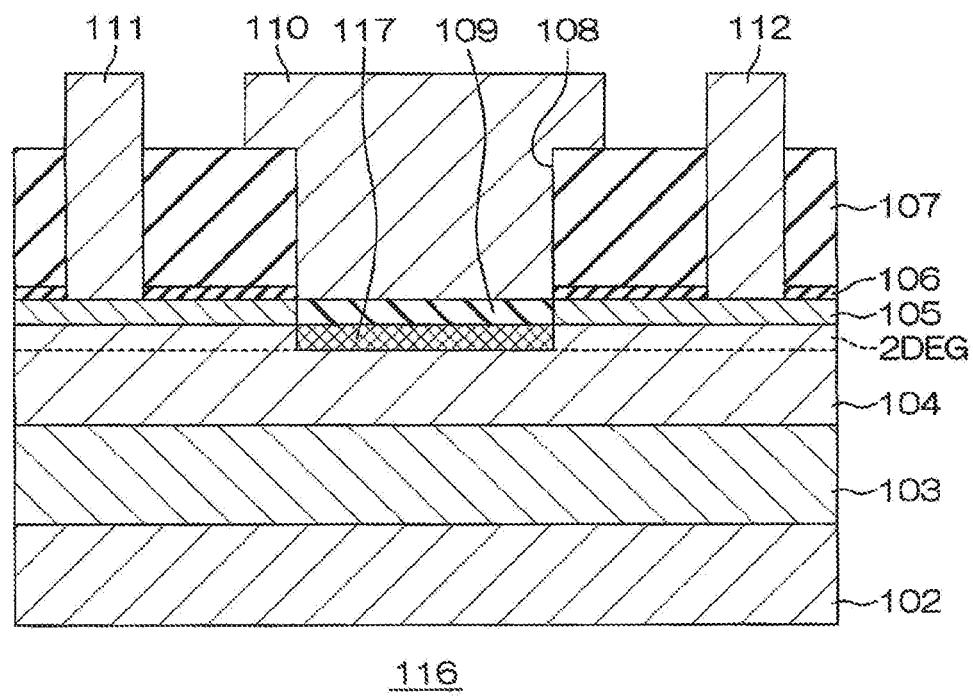
FIG. 4 is a sectional view showing a nitride semiconductor device according to a third reference example.

FIG. 4 is a sectional view showing a nitride semiconductor device 116 according to a third reference example.

In the nitride semiconductor device 116, the gate insulating film 109 made of an oxide of the electron supply layer 105 is formed in the bottom of the trench 108. The oxide of the electron supply layer 105 includes $Ga_2O_3$, $Al_2O_3$ or AlON. In addition, as a portion of the gate insulating film 109, an insulating film 117 made of an oxide of the electron transit layer 104 is formed in a portion in the surface of the electron transit layer 104 which contacts the gate insulating film 109. The oxide of the electron transit layer 104 includes $Ga_2O_3$. Other configurations are the same as the above-described nitride semiconductor device 101 and, therefore, explanation of which will not be repeated.

Figure 5:
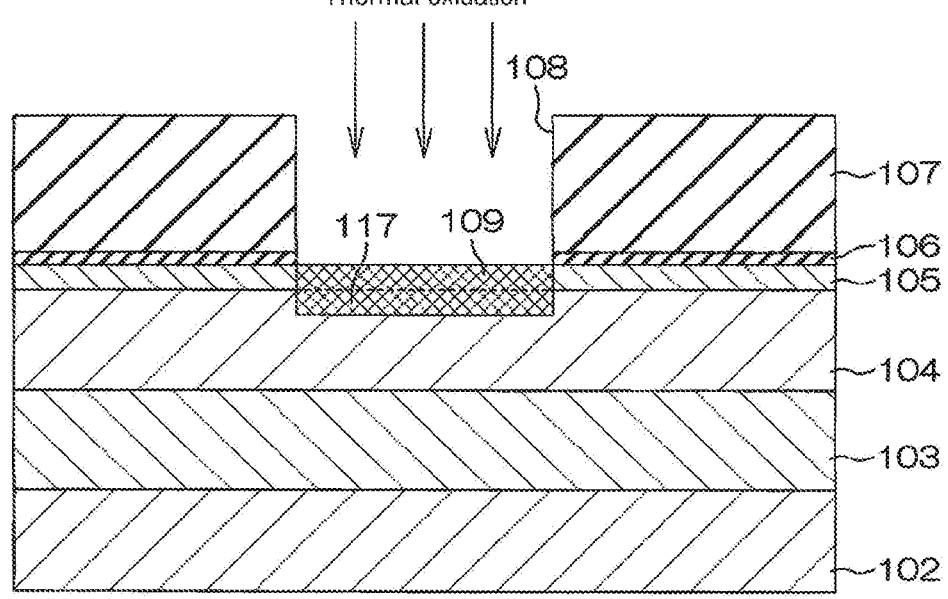
FIG. 5 is a sectional view showing a step in a process of manufacturing the nitride semiconductor device shown in FIG. 4.

FIG. 5 is a sectional view showing a step in a process of manufacturing the nitride semiconductor device 116 shown in FIG. 4. In a method for manufacturing the nitride semiconductor device 116, after the spacer layer 107 and the passivation film 106 are removed, the electron supply layer 105 is subjected to thermal oxidation treatment at a temperature of, e.g., 1000 degrees C. or more, a portion of the electron supply layer 105 is oxidized by the thermal oxidation treatment, thereby forming an oxide of the electron supply layer 105.

Thus, the gate insulating film 109 made of the oxide of the electron supply layer 105 is formed in the bottom of the trench 108. Further, in the thermal oxidation treatment, since the amount of heat applied to each layer is relatively large, damage occurs in a crystal structure of each layer and oxidation proceeds in the successive electron transit layer 104 when the electron supply layer 105 begins to be oxidized. As a result, the surface portion of the electron transit layer 104 is oxidized to form the insulating film 117 made of the oxide of the electron transit layer 104.

In this manner, in the nitride semiconductor device 116 of the third reference example, the insulating film 117 made of the oxide of the electron transit layer 104 is formed in a region where 2DEG is to be formed, by the thermal oxidation treatment, which results in damage to the 2DEG. Therefore, there arises the same kind of problem as the nitride semiconductor device 101 of the first reference example. For the purpose of solving the problems of the nitride semiconductor devices 101, 115 and 116 according to the first to third reference examples, the present inventors suggest configurations of first to sixth embodiments described below.

First Embodiment

Figure 6:
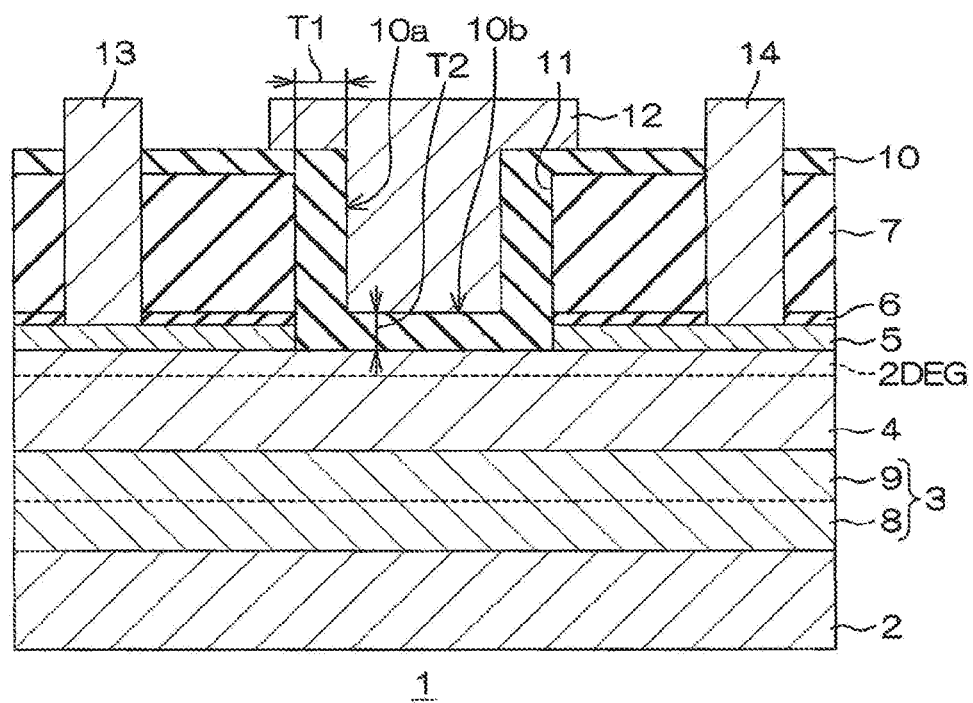
FIG. 6 is a sectional view showing a nitride semiconductor device according to a first embodiment of the present disclosure.

FIG. 6 is a sectional view showing a nitride semiconductor device 1 according to a first embodiment of the present disclosure. FIG. 7 is a TEM (Transmission Electron Microscope) image showing a portion of the nitride semiconductor device 1 shown in FIG. 6.

The nitride semiconductor device 1 is an HEMT using a Group-III nitride semiconductor. The nitride semiconductor device 1 includes a substrate 2. An example of the substrate 2 may include a Si substrate, SiC substrate, sapphire substrate, GaN substrate or the example. On the substrate 2 are stacked a buffer layer 3, an electron transit layer 4, an electron supply layer 5, a passivation film 6 and a nonconductive spacer layer 7 in the order as thy are written. The buffer layer 3 is formed to be coherent to the surface of the substrate 2. The buffer layer 3 may have a stacked structure including a plurality of stacked Group-III nitride semiconductor layers. In this embodiment, the buffer layer 3 includes a first buffer layer 8 formed on the substrate 2, and a second buffer layer 9 stacked on the first buffer layer 8. The first buffer layer 8 includes an AlN film and has a thickness of, e.g., about 0.2 μm. The second buffer layer 9 includes an AlGaN film and has a thickness of, e.g., about 0.2 μm.

The electron transit layer 4 is formed to be coherent to the buffer layer 3. The electron transit layer 4 includes $Ga_xIn_{1-x}N$ (0<x≤1). In this embodiment, the electron transit layer 4 is made of GaN. The thickness of the electron transit layer 4 is, e.g., equal to or less than 0.1 μm and equal to or more than 10 μm. The electron supply layer 5 is formed to be coherent to the electron transit layer 4. The electron supply layer 5 includes $Al_yIn_{1-y}N$ (0<y≤1). In this embodiment, the electron supply layer 5 is made of AlN. The thickness of the electron supply layer 5 is, e.g., equal to or less than 1 Å and equal to or more than 100 Å. 2DEG is formed in the vicinity of an interface in the electron transit layer 4 between the electron transit layer 4 and the electron supply layer 5 (e.g., at a distance of several A or so from the interface).

The passivation film 6 is formed of an insulating film such as, e.g., a SiN or the like and has a thickness of, e.g., equal to or less than 10 Å and equal to or more than 1000 Å. The spacer layer 7 is formed of an insulating film such as, e.g., a $SiO_2$ or the like and has a thickness of, e.g., equal to or less than 1 μm and equal to or more than 10 μm. A gate insulating film 10 contacting the electron transit layer 4 is formed to penetrate through the electron supply layer 5. More specifically, in this embodiment, a trench 11 penetrating through the spacer layer 7, the passivation film 6 and the electron supply layer 5 is formed to expose the electron transit layer 4 and the gate insulating film 10 is formed in the trench 11. The trench is filled with a gate electrode 12 via the gate insulating film 10.

The gate insulating film 10 has a first portion 10a formed along the inner wall of the trench 11 and a second portion 10b formed along the surface of the electron transit layer 4. In some embodiments, a thickness T1 of the first portion 10a in a direction perpendicular to the depth direction of the trench 11 is larger than a thickness T2 of the second portion 10b in the depth direction of the trench 11. Thus, it is possible to prevent a switching noise from occurring due to a reduction of electric capacity between the inner wall of the trench 11 and the gate electrode 12, thereby improving the switching characteristics.

In addition, as shown in FIG. 7, the gate insulating film 10 is formed to have a thickness larger than the total thickness of the electron supply layer 5 and the passivation film 6. In some embodiments, the gate insulating film 10 is formed to have a thickness that causes an electric field E in the gate insulating film to be equal to or less than 10 MV/cm. The electric field E is calculated according to an equation of $E=V_g/T2$ (where, $V_g$ is a voltage applied to the gate electrode 12 and T2 is thickness of the second portion 10b). The gate insulating film 10 may be made of one or more insulating materials selected from a group consisting of $SiO_2$, $Al_2O_3$, AlON and SiN. The gate insulating film 10 may be a stacked film including a plurality of insulating films made of an insulating material selected from this group.

A concave space defined by the gate insulating film 10 is filled with the gate electrode 12. In the trench 11, the gate electrode 12 faces the electron transit layer 4 with the gate insulating film 10 interposed therebetween. A portion of the gate electrode 12 is located on the spacer layer 7. The gate electrode 12 may include one or more conductive materials including Ni, Pt, Mo, W, TiN, Au and Al. A source electrode 13 and a drain electrode 14 are formed with a space from the gate electrode 12. The source electrode 13 and the drain electrode 14 are both formed in ohmic contact with the electron supply layer 5 through the gate insulating film 10 on the spacer layer 7, the spacer layer 7 and the passivation film 6. The source electrode 13 and the drain electrode 14 may be made of Ti and/or Al. If the source electrode 13 and the drain electrode 14 are formed by diffusion of Al, Al of the source electrode 13 and the drain electrode 14 may be diffused into the electron supply layer 5.

As shown in FIG. 7, in the electron transit layer 4, a portion contacting the gate insulating film 10 and a portion contacting the electron transit layer 4 are flat with each other, and more specifically, form one flush surface located in the same plane. In other words, in the electron transit layer 4, a portion forming the bottom of the trench 11 and a portion other than the bottom of the trench 11 are flat with each other and form one surface. Further, in the nitride semiconductor device 1 of this embodiment, unlike the nitride semiconductor device 101 according to the above-described first reference example, the portion of the electron transit layer 4 forming the bottom of the trench 11 is not etched (also see FIG. 1). In other words, a boundary between a portion of the electron transit layer 4 contacting the gate insulating film 10 and a portion contacting the electron transit layer 4 is formed to be flush with each other without a level difference in the surface portion of the electron transit layer 4.

In addition, in the nitride semiconductor device 1 of this embodiment, unlike the nitride semiconductor device 116 according to the above-described third reference example, the insulating film 117 made of the oxide ($Ga_2O_3$) of the electron transit layer 104 is not formed in the portion of the electron transit layer 4 contacting the gate insulating film 10 (also see FIG. 5). In other words, a nitride semiconductor (GaN in this embodiment) of the electron transit layer 4 is exposed from the bottom of the trench 11. Then, the nitride semiconductor of the electron transit layer 4 faces the gate electrode 12 with the gate insulating film 10 contacting the electron transit layer 4 interposed therebetween.

Figure 8A:
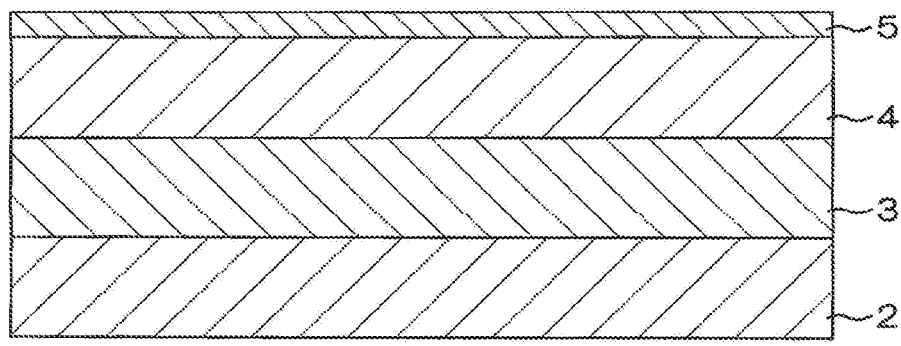
FIG. 8A is a sectional view showing a step in a process of manufacturing the nitride semiconductor device shown in FIG. 6.

Next, a method for manufacturing the nitride semiconductor device 1 will be described with reference to FIGS. 8A to 8E. FIGS. 8A to 8E are sectional views showing steps in a process of manufacturing the nitride semiconductor device 1 shown in FIG. 6. In order to manufacture the nitride semiconductor device 1, the buffer layer 3, the electron transit layer 4 (GaN in this embodiment) and the electron supply layer 5 (AlN in this embodiment) are coherently grown on the substrate 2 in the order as they are written by means of, e.g., a CVD method or the like, as shown in FIG. 8A.

Figure 8B:
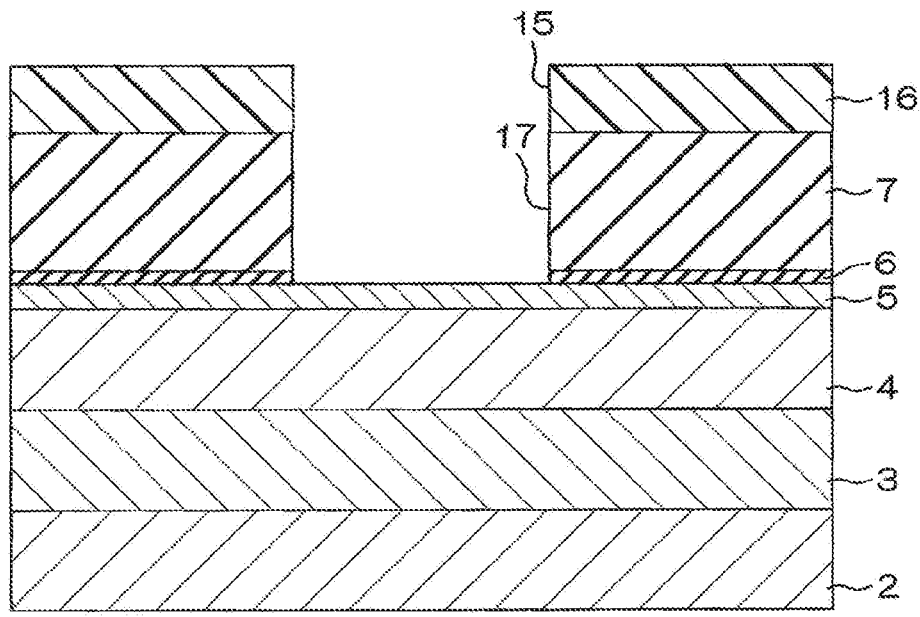
FIG. 8B is a sectional view showing a step subsequent to the step shown in FIG. 8A.

Next, as shown in FIG. 8B, the passivation film 6 and the spacer layer 7 are formed on the electron supply layer 5 in turn by means of, e.g., a CVD method or the like. Next, a mask 16 having an opening 15 selectively in a region in which the trench 11 is to be formed is formed on the spacer layer 7. Next, an unnecessary portion of the spacer layer 7 and the passivation film 6 is partially removed by means of dry etching (e.g., reactive ion etching) using the mask 16 as a mask. Thus, as a portion of the trench 11, an opening 17 is formed. A portion of the electron supply layer 5 is exposed in the bottom of the electron supply layer 5. Thereafter, the mask 16 is removed.

Next, as shown in FIG. 8C, the electron supply layer 5 is selectively oxidized by means of a plasma oxidation method, thereby forming an oxide 18 of the electron supply layer 5 in a portion of the electron supply layer 5. The oxide 18 includes AlON or $Al_2O_3$. The plasma oxidation method is performed in an oxygen gas atmosphere at a temperature of 100 degrees C. to 900 degrees C. for a time of one hour to ten hours. The oxygen concentration in the atmosphere is, e.g., about 30%. For example, the plasma oxidation method may be performed in an oxygen gas atmosphere at 100 degrees C. for ten hours or in an oxygen gas atmosphere at 900 degrees C. for one hour.

According to the plasma oxidation method, when the oxide 18 is formed in the portion of the electron supply layer 5, no or little oxygen in the atmosphere enters the electron transit layer 4. Thus, the electron supply layer 5 exposed from the opening 17 and located on the electron transit layer 4 is entirely oxidized to form the oxide 18. On the other hand, the surface portion of the electron transit layer 4 is not oxidized. Therefore, in the electron transit layer 4, a portion contacting the oxide 18 and a portion contacting the electron supply layer 5 are formed to be flush with each other.

Next, as shown in FIG. 8D, the oxide 18 is removed by etching. The etching of the oxide 18 may be wet etching. In this case, the oxide 18 may be removed by a solution, e.g., SPM (Sulfuric acid hydrogen Peroxide Mixture) which is a mixture of sulfuric acid and hydrogen peroxide, by which the electron transit layer 4 is not removed. The oxide 18 including MON or $Al_2O_3$ has etching selectivity to the electron transit layer 4 including GaN. Therefore, it is possible to etch only the oxide 18 while avoiding the etching of the electron transit layer 4. Thus, the trench 11 to expose the surface of the electron transit layer 4 is formed. In addition, in the electron transit layer 4, a portion forming the bottom of the trench 11 and a portion other than the bottom of the trench 11 are formed to be flush with each other.

Figure 8E:
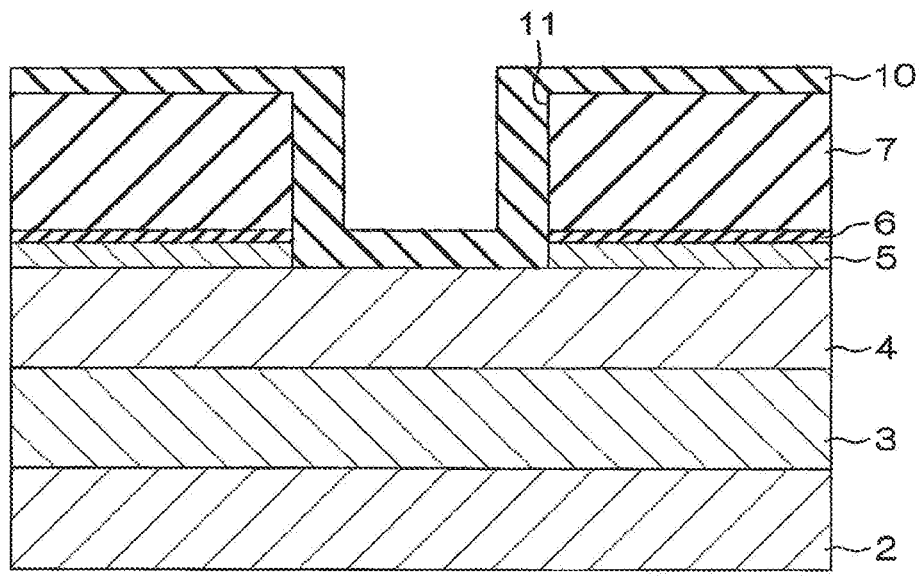
FIG. 8E is a sectional view showing a step subsequent to the step shown in FIG. 8D.

Next, as shown in FIG. 8E, a predetermined insulating material is deposited by, e.g., a CVD method or the like to form the gate insulating film 10. Thereafter, the gate electrode 12, the source electrode 13 and the drain electrode 14 are formed. Thus, the nitride semiconductor device 1 is formed. As described above, according to the method of this embodiment, the electron supply layer 5 is selectively oxidized by the plasma oxidation method to thereby form the oxide 18 in a portion of the electron supply layer 5. According to the plasma oxidation method, when the oxide 18 is formed in the portion of the electron supply layer 5, since no or little oxygen in the atmosphere enters the electron transit layer 4, it is possible to form the oxide 18 in the electron supply layer 5 while avoiding oxidation of the electron transit layer 4. Thus, it is possible to form the electron transit layer 4 in which a portion contacting the oxide 18 and a portion contacting the electron supply layer 5 are flush with each other while effectively preventing the electron transit layer 4 from being damaged.

Moreover, the oxide 18 formed in the electron supply layer 5 has the etching selectivity to the electron transit layer 4. Therefore, it is possible to remove the oxide 18 while preventing the electron transit layer 4 from being etched. Thus, as shown in FIG. 7, it is possible to form the electron transit layer 4 in which a portion contacting the gate insulating film 10 and a portion contacting the electron transit layer 4 are flush with each other. As a result, it is possible to provide a nitride semiconductor device 1 capable of realizing a good normally-off operation, and a method for manufacturing the same.

Second Embodiment

Figure 9:
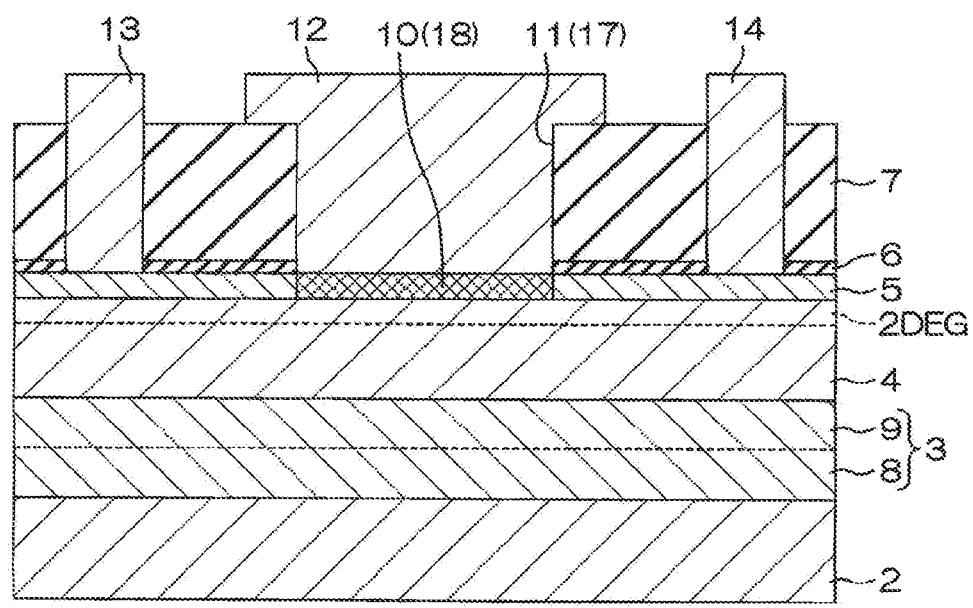
FIG. 9 is a sectional view showing a nitride semiconductor device according to a second embodiment of the present disclosure.

FIG. 9 is a sectional view showing a nitride semiconductor device 21 according to a second embodiment of the present disclosure. In FIG. 9, the same elements as FIG. 6 and so on are denoted by the same reference numerals and explanation of which will not be repeated.

In the nitride semiconductor device 21, the gate insulating film 10 is formed by using the above-described oxide 18 of the electron supply layer 5 (see FIG. 8C). That is, the gate insulating film 10 includes the oxide 18 of the electron supply layer 5 and is formed to be integrated with the electron supply layer 5. A thickness of the gate insulating film 10 is substantially equal to a thickness of the electron supply layer 5. On the other hand, the trench 11 is formed by using the above-described opening 17 (see FIG. 8C) while penetrating through the spacer layer 7 and the passivation film 6 so as to expose the gate insulating film 10, that is, the oxide 18 of the electron supply layer 5. In the trench 11, the gate electrode 12 faces the electron transit layer 4 with the gate insulation film 10 interposed therebetween.

Such a nitride semiconductor device 21 can be manufactured by performing a step of forming the gate electrode 12, the source electrode 13 and the drain electrode 14 after the above-described step of FIG. 8C. As described above, according to this embodiment, the oxide 18 of the electron supply layer 5 can be, as it is, used as a portion of the gate insulating film 10. Thus, since it is possible to form the electron transit layer 4 in which a portion contacting the gate insulating film 10 and a portion contacting the electron transit layer 4 are flush with each other, it is possible to provide a nitride semiconductor device 21 capable of realizing a good normally-off operation, and a method for manufacturing the same.

Third Embodiment

Figure 10:
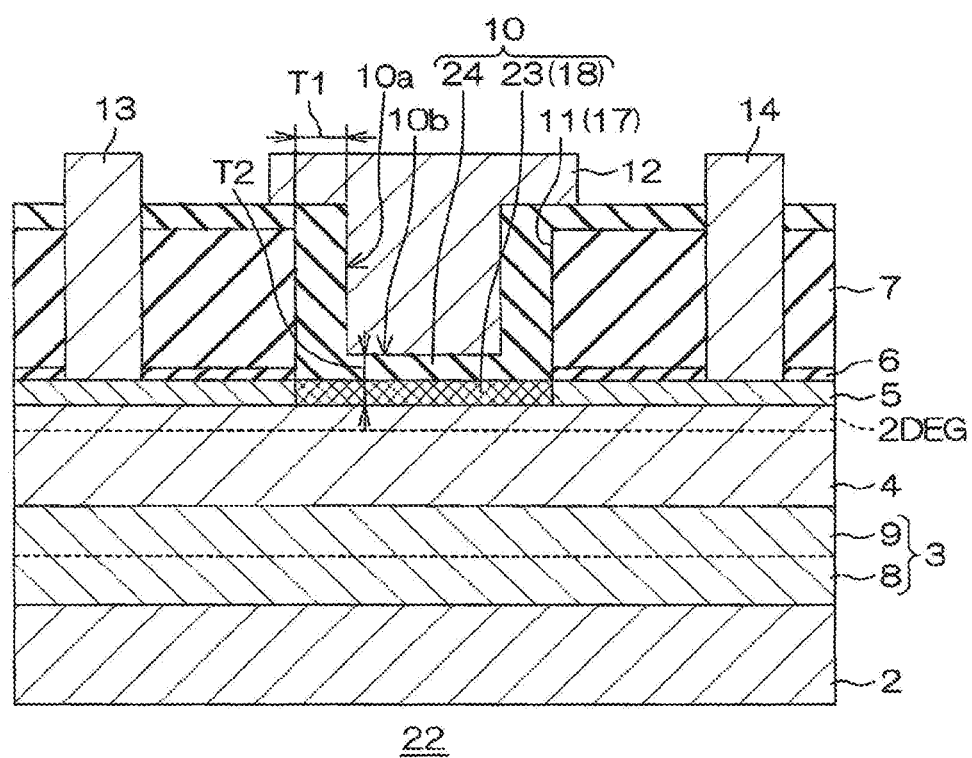
FIG. 10 is a sectional view showing a nitride semiconductor device according to a third embodiment of the present disclosure.

FIG. 10 is a sectional view showing a nitride semiconductor device 22 according to a third embodiment of the present disclosure. In FIG. 10, the same elements as FIG. 6 and so on are denoted by the same reference numerals and explanation of which will not be repeated.

In the nitride semiconductor device 22, the gate insulating film 10 has a stacked structure including a lower layer portion 23 formed on the electron transit layer 4 so as to contact the electron transit layer 4 and an upper layer portion 24 formed on the lower layer portion 23. The lower layer portion 23 of the gate insulating film 10 includes the above-described oxide 18 of the electron supply layer 5 and is formed to be integrated with the electron supply layer 5. The upper layer portion 24 of the gate insulating film 10 is formed on the lower layer portion 23 along the inner wall of the trench 11. The upper layer portion 24 of the gate insulating film 10 may be made of one or more insulating materials selected from a group consisting of $SiO_2$, $Al_2O_3$, AlON and SiN.

Such a nitride semiconductor device 22 can be manufactured by adding a step of depositing an insulating material for the upper layer portion 24 of the gate insulating film 10 on the oxide 18 of the electron supply layer 5 by means of, e.g., a CVD method, before the step of forming the gate electrode 12 after the above-described step of FIG. 8C. As described above, according to this embodiment, since it is possible to form the electron transit layer 4 in which a portion contacting the gate insulating film 10 and a portion contacting the electron transit layer 4 are flush with each other, it is possible to provide a nitride semiconductor device 22 capable of realizing a good normally-off operation, and a method for manufacturing the same. In addition, since it is possible to form a thick gate insulating film 10 including the oxide 18 of the electron supply layer 5, it is possible to increase a breakdown voltage (e.g., a breakdown resistance of the gate insulating film 10) of the nitride semiconductor device 22.

Fourth Embodiment

Figure 11:
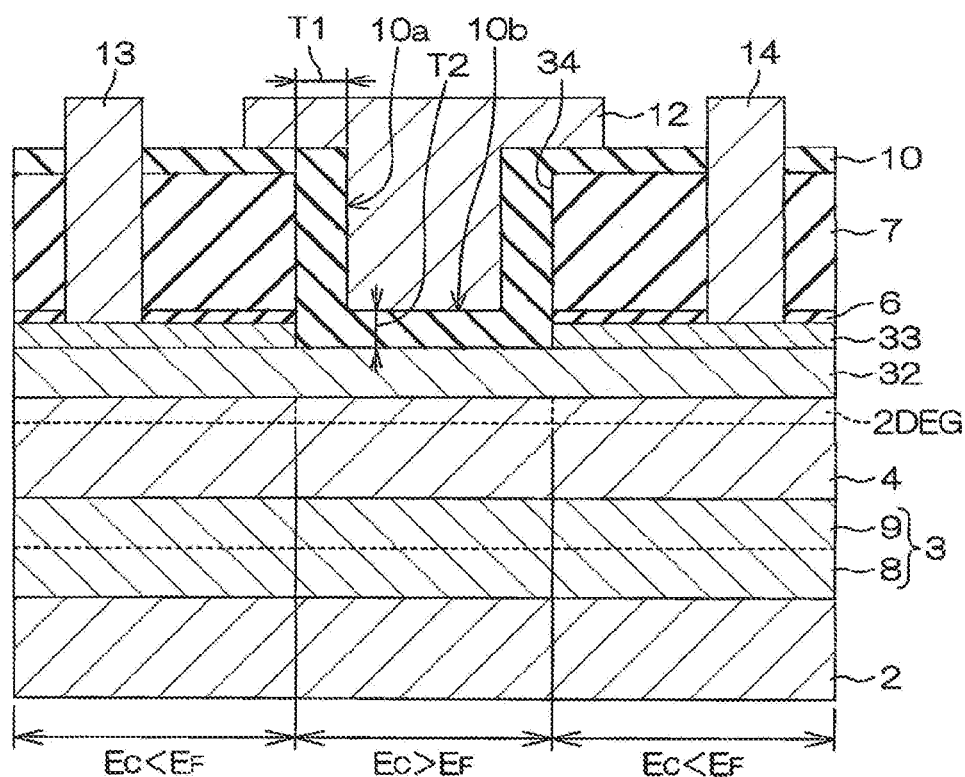
FIG. 11 is a sectional view showing a nitride semiconductor device according to a fourth embodiment of the present disclosure.

FIG. 11 is a sectional view showing a nitride semiconductor device 31 according to a fourth embodiment of the present disclosure. In FIG. 11, the same elements as FIG. 6 and so on are denoted by the same reference numerals and explanation of which will not be repeated.

The nitride semiconductor device 31 includes a first electron supply layer 32 formed on the electron transit layer 4 and a second electron supply layer 33 formed on the first electron supply layer 32. The above-described passivation film 6 and spacer layer 7 are stacked on the second electron supply layer 33. The first electron supply layer 32 includes a nitride semiconductor having a lattice constant smaller than that of the electron transit layer 4 and is formed to be coherent to the electron transit layer 4. The first electron supply layer 32 is made of $Al_aGa_bIn_cN$ ($0 \leq a \leq 1$, $0 \leq b \leq 1$, $0 \leq c \leq 1$ and $a+b+c=1$). In this embodiment, the first electron supply layer 32 is made of $Al_aGa_bN$ ($0 \leq a \leq 0.5$, $0.5 \leq b \leq 1.0$ and $a+b=1$). The first electron supply layer 32 may have a stacked structure including a plurality of stacked nitride semiconductor layers made of $Al_aGa_bIn_cN$ ($0 \leq a \leq 1$, $0 \leq b \leq 1$, $0 \leq c \leq 1$ and $a+b+c=1$). For example, the first electron supply layer 32 may have a stacked structure where a GaN layer is stacked on an AlGaN layer. A thickness of the first electron supply layer 32 is, e.g., between 10 Å and 1000 Å.

The second electron supply layer 33 includes a nitride semiconductor having a lattice constant smaller than that of the first electron supply layer 32 and is formed to be coherent to the first electron supply layer 32. The second electron supply layer 33 is made of $Al_yIn_{1-y}N$ ($0 < y \leq 1$). In this embodiment, the second electron supply layer 33 is made of AlN. A thickness of the second electron supply layer 33 is smaller than that of the first electron supply layer 32. For example, thickness of the second electron supply layer 33 is between 1 Å and 100 Å. The gate insulating film 10 is buried in the second electron supply layer 33 so as to face the first electron supply layer 32.

Specifically, in this embodiment, the gate insulating film 10 contacting the first electron supply layer 32 through the second electron supply layer 33 is formed on the first electron supply layer 32. More specifically, a trench 34 penetrating through the spacer layer 7, the passivation film 6 and the second electron supply layer 33 is formed to expose the first electron supply layer 32, and the gate insulating film 10 is formed in the trench 34. The gate electrode 12 is buried in the trench 34 through the gate insulating film 10. The gate electrode 12 is buried in a concave space defined by the gate insulating film 10 and faces the electron transit layer 4 with the gate insulating film 10 and the first electron supply layer 32 interposed therebetween.

In this embodiment, the first electron supply layer 32, a portion contacting the gate insulating film 10 and a portion contacting the second electron supply layer 33 are flat with each other, and more specifically, form one flush surface located in the same plane. In other words, in the first electron supply layer 32, a portion forming the bottom of the trench 34 and a portion other than the bottom of the trench 34 are flat with each other and form one surface. Further, a boundary between a portion of the first electron supply layer 32 contacting the gate insulating film 10 and a portion contacting the second electron supply layer 33 is formed to be flush with each other without a level difference in a surface portion of the first electron supply layer 32.

In addition, an insulating film made of an oxide of the first electron supply layer 32 is not formed in a portion of the first electron supply layer 32 contacting the gate insulating film 10. That is, a nitride semiconductor layer (AlGaN in this embodiment) of the first electron supply layer 32 is exposed from the bottom of the trench 34. Then, the nitride semiconductor layer faces the gate electrode 12 with the gate insulating film 10 contacting the first electron supply layer 32 interposed therebetween.

In this embodiment, as the second electron supply layer 33 is partially removed, a conduction band energy level $E_C$ at an interface between the first electron supply layer 32 immediately under the gate electrode 12 and the electron transit layer 4 is adjusted. More specifically, the conduction band energy level $E_C$ at the interface between the first electron supply layer 32 immediately under the gate electrode 12 and the electron transit layer 4 is larger than a Fermi energy level $E_F$ (i.e., $E_C>E_F$). Further, a conduction band energy level $E_C$ at an interface between the first electron supply layer 32, which does not lie immediately under the gate electrode 12, and the electron transit layer 4 is smaller than the Fermi energy level $E_F$ (i.e., $E_C<E_F$).

When the gate electrode 12 is turned on, the conduction band energy level $E_C$ at the interface between the first electron supply layer 32 immediately under the gate electrode 12 and the electron transit layer 4 becomes smaller than the Fermi energy level $E_F$ (i.e., $E_C<E_F$). Thus, 2DEG is formed immediately under the gate electrode 12, thereby flowing a current between the source electrode 13 and the drain electrode 14. On the other hand, when the gate electrode 12 is turned off, the conduction band energy level $E_C$ at the interface between the first electron supply layer 32 immediately under the gate electrode 12 and the electron transit layer 4 becomes larger than the Fermi energy level $E_F$ (i.e., $E_C>E_F$). Thus, 2DEG is not formed immediately under the gate electrode 12, thereby preventing a current from being between the source electrode 13 and the drain electrode 14. In this embodiment, a normally-off operation is realized in this manner.

Figure 12A:
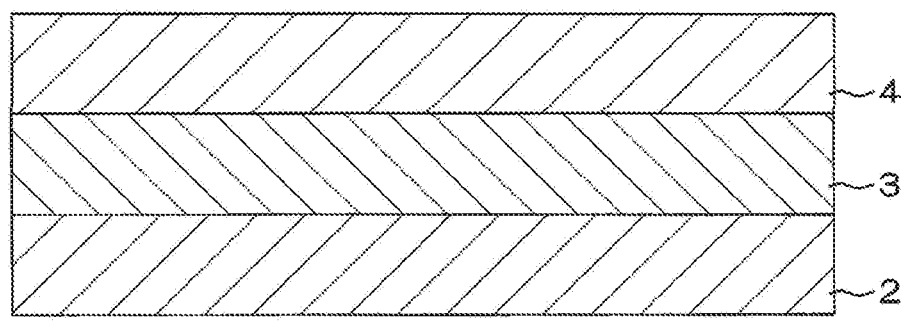
FIG. 12A is a sectional view showing a step in a process of manufacturing the nitride semiconductor device shown in FIG. 11.

FIGS. 12A to 12F are sectional views showing steps in a process of manufacturing the nitride semiconductor device 31 shown in FIG. 11. As shown in FIG. 12A, in order to manufacture the nitride semiconductor device 31, first, the substrate 2 is prepared. Next, the buffer layer 3 and the electron transit layer 4 are coherently grown on the substrate 2 in the order as they are written by, e.g., a CVD method or the like.

Figure 12B:
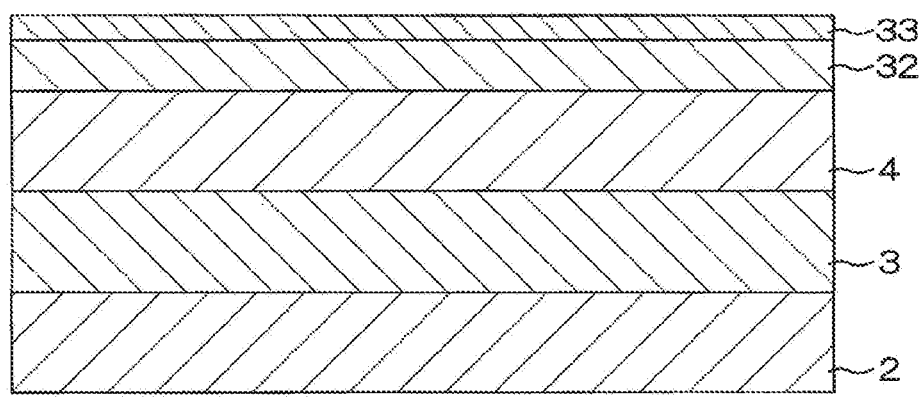
FIG. 12B is a sectional view showing a step subsequent to the step shown in FIG. 12A.

Next, as shown in FIG. 12B, the first electron supply layer 32 (AlGaN in this embodiment) and the second electron supply layer 33 (AlN in this embodiment) are coherently grown in the order as they are written by, e.g., a CVD method or the like. At this time, the first electron supply layer 32 is formed on the electron transit layer 4 such that the conduction band energy level $E_C$ at the interface between the first electron supply layer 32 and the electron transit layer 4 becomes larger than the Fermi energy level $E_F$. Then, the second electron supply layer 33 is formed on the first electron supply layer 32 such that the conduction band energy level $E_C$ at the interface between the first electron supply layer 32 and the electron transit layer 4 becomes smaller than the Fermi energy level $E_F$.

Figure 12C:
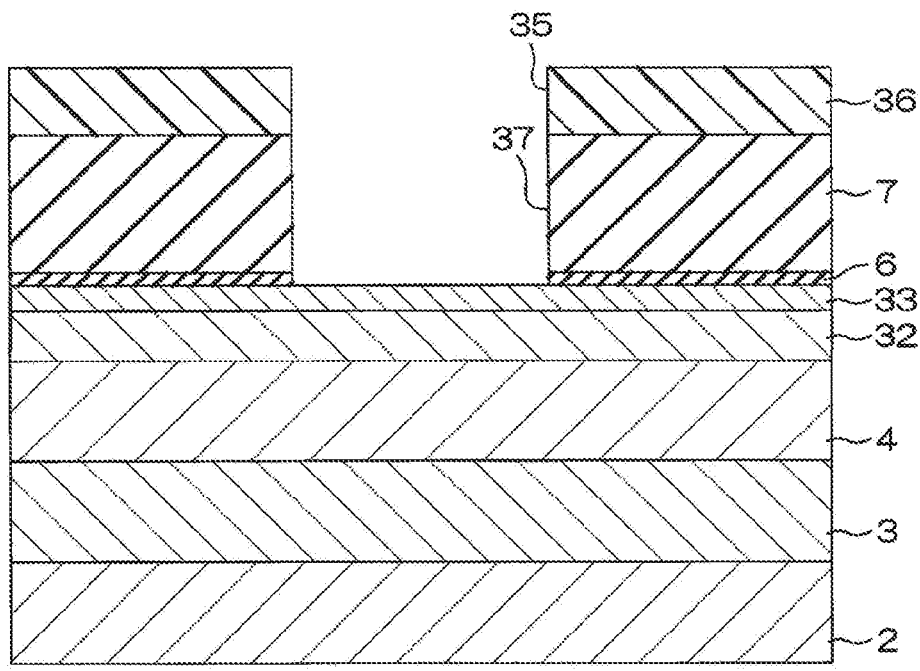
FIG. 12C is a sectional view showing a step subsequent to the step shown in FIG. 12B.

Next, as shown in FIG. 12C, the passivation film 6 and the spacer layer 7 are formed on the second electron supply layer 33 in turn by, e.g., a CVD method or the like. Next, a mask 36 having an opening 35 selectively in a region in which the trench 34 is to be formed is formed on the spacer layer 7. Next, an unnecessary portion of the spacer layer 7 and the passivation film 6 is partially removed by dry etching (e.g., reactive ion etching) using the mask 36 as a mask. Thus, as a portion of the trench 34, an opening 37 is formed. A portion of the second electron supply layer 33 is exposed in the bottom of the opening 37. Thereafter, the mask 36 is removed.

Figure 12D:
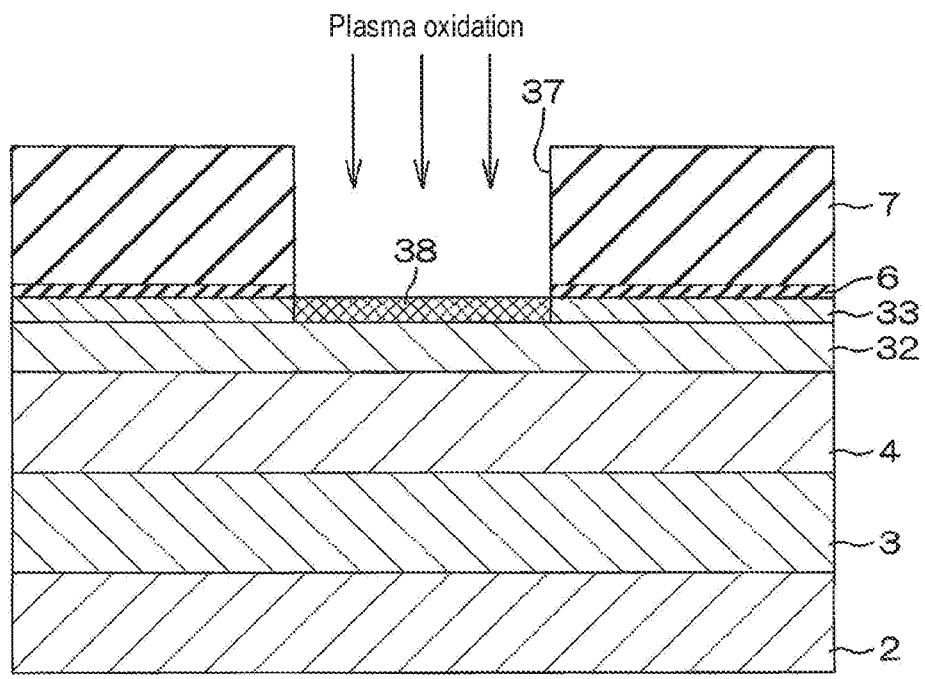
FIG. 12D is a sectional view showing a step subsequent to the step shown in FIG. 12C.

Next, as shown in FIG. 12D, under the same conditions as FIG. 8C, the second electron supply layer 33 is selectively oxidized by a plasma oxidation method, thereby forming an oxide 38 of the second electron supply layer 33 in a portion of the second electron supply layer 33. The oxide 38 includes AlON or $Al_2O_3$. In the portion of the second electron supply layer 33 where the oxide 38 is formed, a distortion disappears and a spontaneous polarization is annihilated. Therefore, the conduction band energy level $E_C$ at the interface between the first electron supply layer 32 immediately under the oxide 38 and the electron transit layer 4 becomes smaller than the Fermi energy level $E_F$.

In addition, according to the plasma oxidation method, when the oxide 38 is formed in the second electron supply layer 33, no or little oxygen in the atmosphere enters the first electron supply layer 32. Thus, the second electron supply layer 33 exposed from the opening 37 and located on the first electron supply layer 32 is entirely oxidized to form the oxide 38. On the other hand, the surface portion of the first electron supply layer 32 is not oxidized. Therefore, the first electron supply layer 32 is formed such that a portion contacting the oxide 38 and a portion contacting the second electron supply layer 33 are formed to be flush with each other. In addition, the electron transit layer 4 is neither oxidized nor exposed to the outside.

Figure 12E:
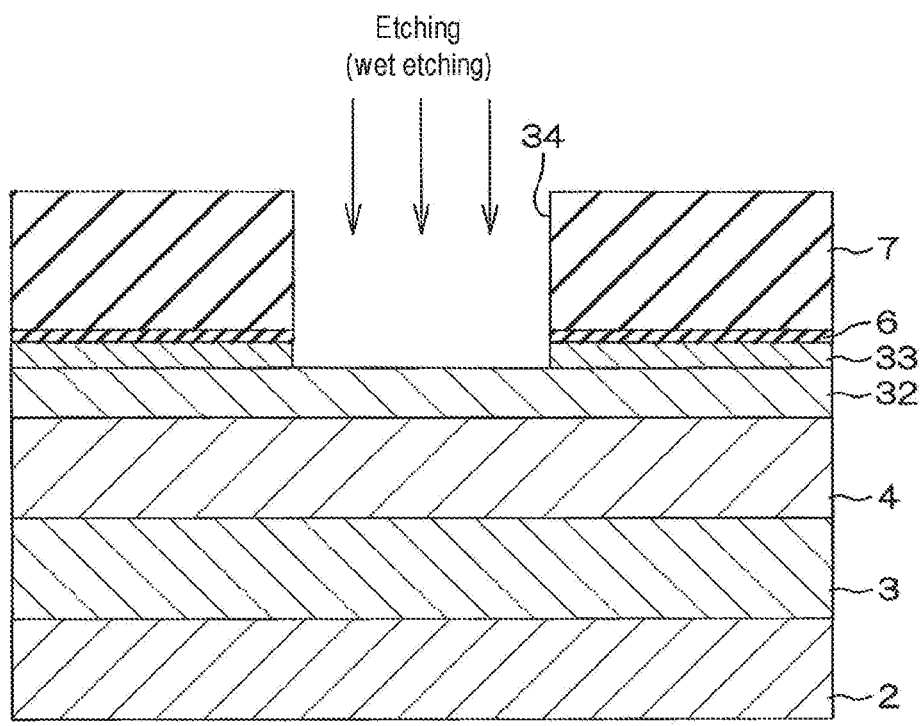
FIG. 12E is a sectional view showing a step subsequent to the step shown in FIG. 12D.

Next, as shown in FIG. 12E, under the same conditions as FIG. 8D, the oxide 38 is removed by etching. The oxide 38 including AlON or $Al_2O_3$ has etching selectivity to the first electron supply layer 32 including AlGaN. Therefore, it is possible to etch only the oxide 38 while avoiding the etching of the first electron supply layer 32. Thus, the trench 34 to expose the surface of the first electron supply layer 32 is formed. In addition, in the first electron supply layer 32, a portion forming the bottom of the trench 34 and a portion other than the bottom of the trench 34 are formed to be flush with each other.

Figure 12F:
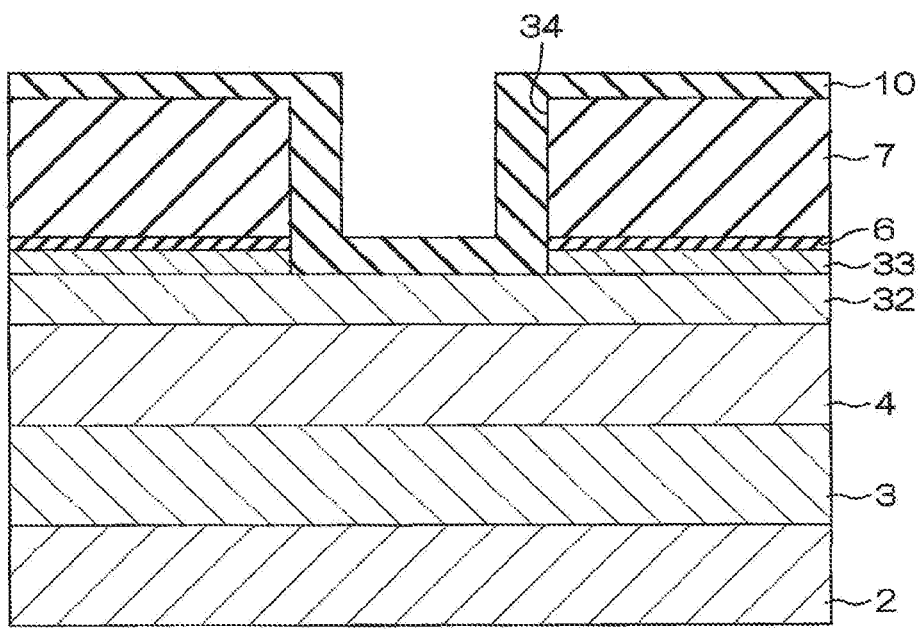
FIG. 12F is a sectional view showing a step subsequent to the step shown in FIG. 12E.

Next, as shown in FIG. 12F, an insulating material is deposited by, e.g., a CVD method or the like to form the gate insulating film 10. Thereafter, the gate electrode 12, the source electrode 13 and the drain electrode 14 are formed. Thus, the nitride semiconductor device 31 is formed. As described above, according to this embodiment, since the electron transit layer 4 is not exposed to the air after the first electron supply layer 32 is formed, it is possible to effectively prevent the electron transit layer 4 from being damaged due to oxidation or etching. That is, since the electron transit layer 4 is not exposed to the air, 2DEG is not damaged due to oxidation or etching. Thus, it is possible to provide a nitride semiconductor device 31 capable of realizing a stable normally-off operation, and a method for manufacturing the same.

In addition, the oxide 38 formed in the second electron supply layer 33 has the etching selectivity to the first electron supply layer 32. Therefore, it is possible to remove the oxide while preventing the first electron supply layer 32 from being etched. Thus, since it is possible to prevent the thickness of the first electron supply layer 32 from being varied due to etching or the like, it is possible to form the first electron supply layer 32 with a thickness as designed. As a result, it is possible to effectively control a relationship between the conduction band energy level $E_C$ and the Fermi energy level $E_F$.

Fifth Embodiment

Figure 13:
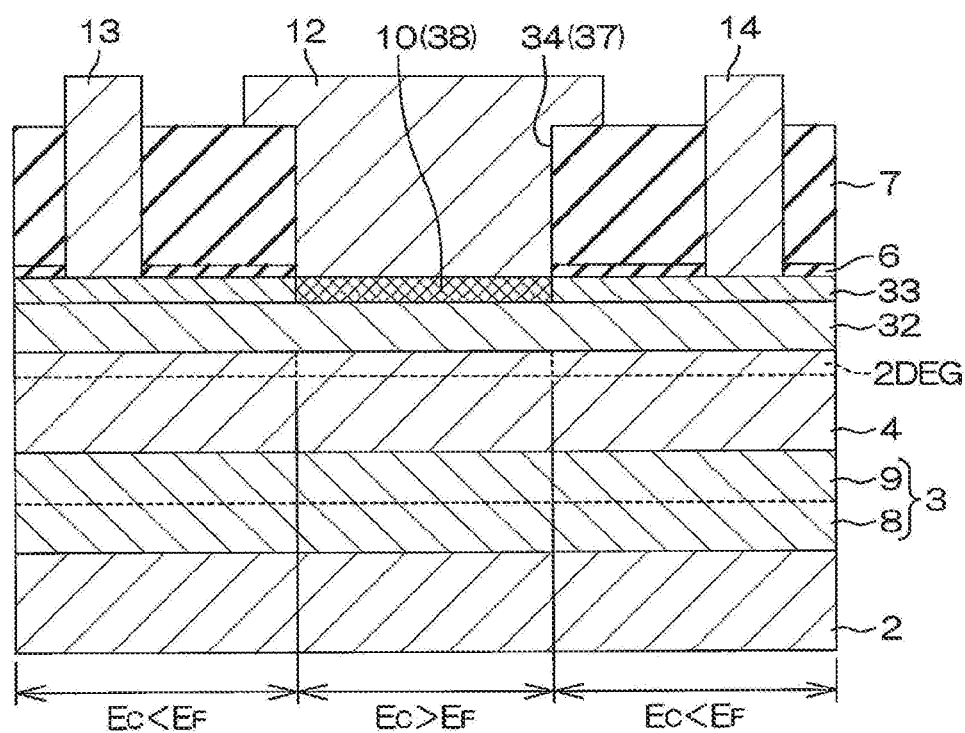
FIG. 13 is a sectional view showing a nitride semiconductor device according to a fifth embodiment of the present disclosure.

FIG. 13 is a sectional view showing a nitride semiconductor device 41 according to a fifth embodiment of the present disclosure. In FIG. 13, the same elements as FIG. 11 and so on are denoted by the same reference numerals and explanation of which will not be repeated.

In the nitride semiconductor device 41, the gate insulating film 10 is formed by using the above-described oxide 38 of the second electron supply layer 33 (see FIG. 8D). That is, the gate insulating film 10 includes the oxide 38 of the second electron supply layer 33 and is formed to be integrated with the second electron supply layer 33. A thickness of the gate insulating film 10 is substantially equal to a thickness of the second electron supply layer 33. On the other hand, the trench 34 is formed by using the above-described opening 37 (see FIG. 8D) while penetrating through the spacer layer 7 and the passivation film 6 so as to expose the gate insulating film 10, that is, the oxide 38 of the second electron supply layer 33. In the trench 34, the gate electrode 12 faces the electron transit layer 4 with the gate insulation film 10 and the first electron supply layer 32 interposed therebetween.

Such a nitride semiconductor device 41 can be manufactured by performing a step of forming the gate electrode 12, the source electrode 13 and the drain electrode 14 after the above-described step of FIG. 12D. As described above, according to this embodiment, the oxide 38 of the second electron supply layer 33 can be, as it is, used as a portion of the gate insulating film 10. Therefore, since the electron transit layer 4 is not exposed to the air after the first electron supply layer 32 is formed, it is possible to effectively prevent the electron transit layer 4 from being damaged. Thus, it is possible to provide a nitride semiconductor device 41 capable of realizing a stable normally-off operation, and a method for manufacturing the same.

Sixth Embodiment

Figure 14:
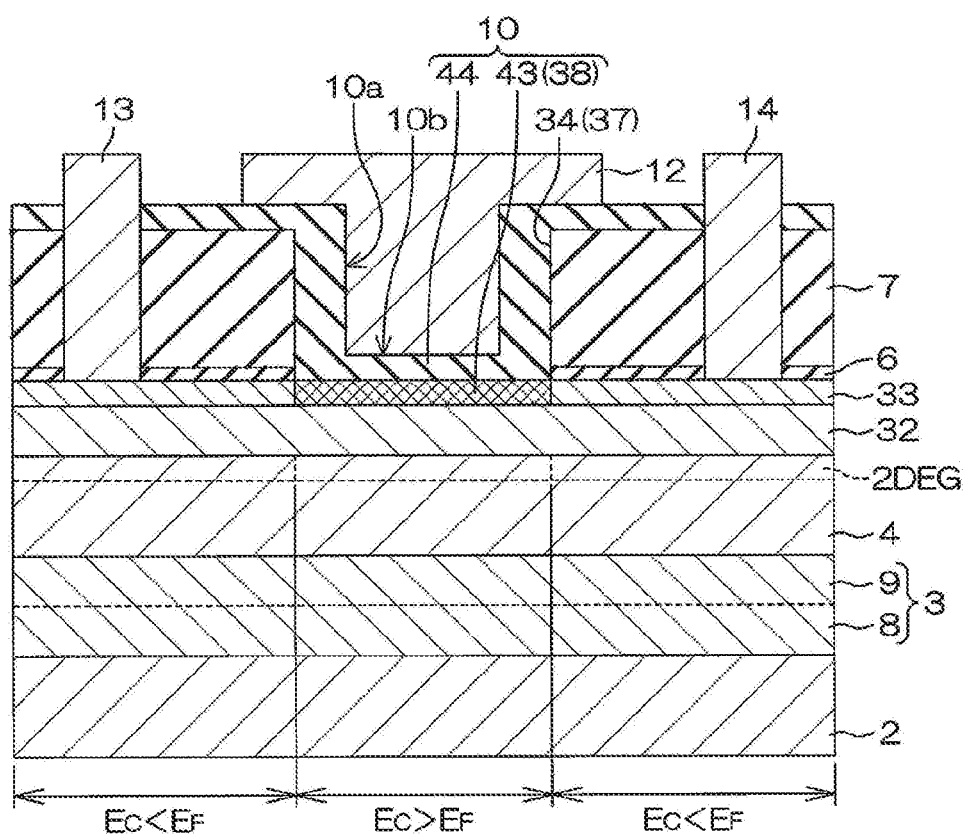
FIG. 14 is a sectional view showing a nitride semiconductor device according to a sixth embodiment of the present disclosure.

FIG. 14 is a sectional view showing a nitride semiconductor device 42 according to a sixth embodiment of the present disclosure. In FIG. 14, the same elements as FIG. 13 and so on are denoted by the same reference numerals and explanation of which will not be repeated.

In the nitride semiconductor device 42, the gate insulating film 10 has a stacked structure including a lower layer portion 43 formed on the first electron supply layer 32 so as to contact the first electron supply layer 32 and an upper layer portion 44 formed on the lower layer portion 43. The lower layer portion 43 of the gate insulating film 10 includes the above-described oxide 38 of the second electron supply layer 33 and is formed to be integrated with the second electron supply layer 33. The upper layer portion 44 of the gate insulating film 10 is formed on the lower layer portion 43 along the inner wall of the trench 34. The upper layer portion 44 of the gate insulating film 10 may be made of one or more insulating materials selected from a group consisting of $SiO_2$, $Al_2O_3$, AlON and SiN.

Such a nitride semiconductor device 42 can be manufactured by adding a step of depositing an insulating material for the upper layer portion 44 of the gate insulating film 10 on the oxide 38 of the second electron supply layer 33 by means of, e.g., a CVD method, before the step of forming the gate electrode 12 after the above-described step of FIG. 12D. As described above, according to this embodiment, the oxide 38 of the second electron supply layer 33 can be, as it is, used as a portion of the gate insulating film 10. Therefore, since the electron transit layer 4 is not exposed to the air after the first electron supply layer 32 is formed, it is possible to effectively prevent the electron transit layer 4 from being damaged. Thus, it is possible to provide a nitride semiconductor device 42 capable of realizing a stable normally-off operation, and a method for manufacturing the same. In addition, since it is possible to form a thick gate insulating film 10 including the oxide 38 of the second electron supply layer 33, it is possible to increase a breakdown voltage (e.g., a breakdown resistance of the gate insulating film 10) of the nitride semiconductor device 42.

Although a plurality of embodiments of the present disclosure has been described in the above, the present disclosure may be practiced in different forms. For example, although it has been illustrated in the above embodiments that the gate insulating film 10 is formed in a portion in the trench 11 and 34, the gate insulating film 10 may be formed such that the trench 11 and 34 is filled with the gate insulating film 10.

Figure 15:
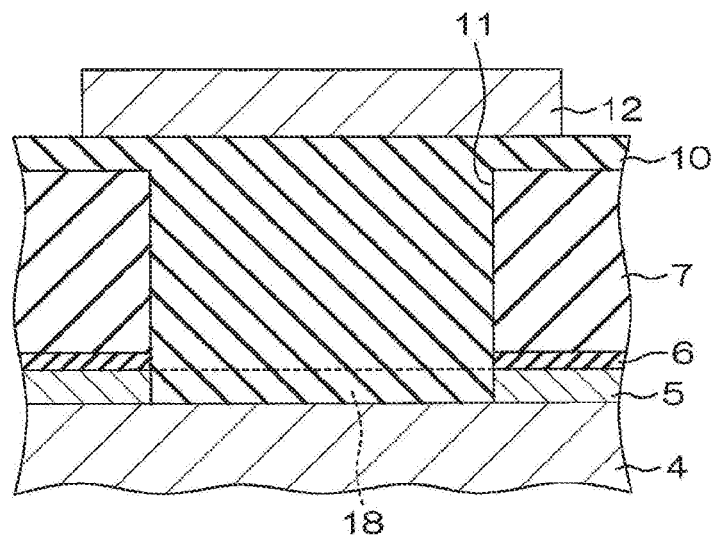
FIG. 15 is a sectional view showing a portion of a nitride semiconductor device according to one modification.
Figure 16:
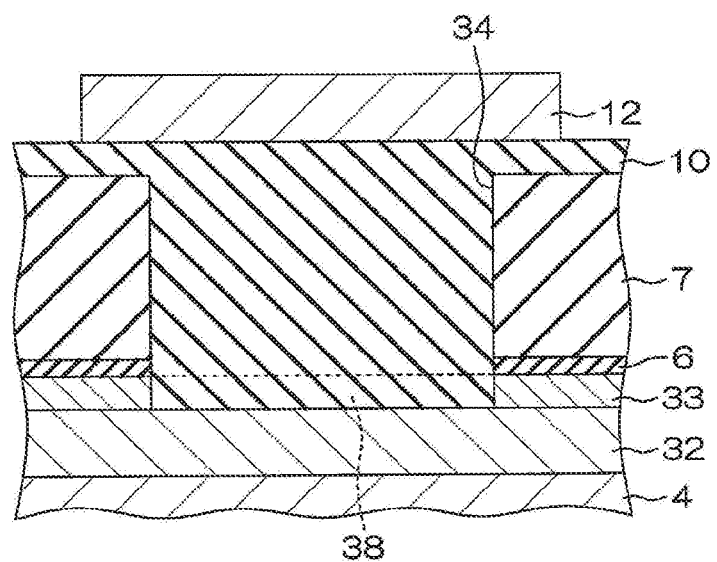
FIG. 16 is a sectional view showing a portion of a nitride semiconductor device according to another modification.

In this case, in the above first to third embodiments, as shown in FIG. 15, the gate electrode 12 is formed on the gate insulating film 10 with which the trench 11 is fully filled. The gate electrode 12 faces the electron transit layer 4 with the gate insulating film 10 interposed therebetween. Of course, the gate insulating film 10 may include the oxide 18 of the electron supply layer 5. In the above fourth to sixth embodiments, as shown in FIG. 16, the gate electrode 12 is formed on the gate insulating film 10 with which the trench 34 is fully filled. The gate electrode 12 faces the electron transit layer 4 with the gate insulating film 10 and the first electron supply layer 32 interposed therebetween. Of course, the gate insulating film 10 may include the oxide 38 of the second electron supply layer 33.

In addition, it has been illustrated in the above fourth embodiment that the oxide 38 of the second electron supply layer 33 is formed and removed to expose the first electron supply layer 32 (also see the step of FIG. 12D). However, it is not necessary to remove the oxide 38 of the second electron supply layer 33 to expose the first electron supply layer 32. That is, in the step of FIG. 12D, a portion of the second electron supply layer 33 may be left without being the oxide 38 as long as the conduction band energy level $E_C$ at the interface between the first electron supply layer 32 immediately under the oxide 38 and the electron transit layer 4 can become smaller than the Fermi energy level $E_F$. Therefore, in the configuration shown in FIG. 11, immediately under the gate electrode 12, a nitride semiconductor material forming the second electron supply layer 33 between the oxide 38 and the first electron supply layer 32 may be left as long as a relationship of the conduction band energy level $E_C$>the Fermi energy level $E_F$ can be satisfied.

Figure 17:
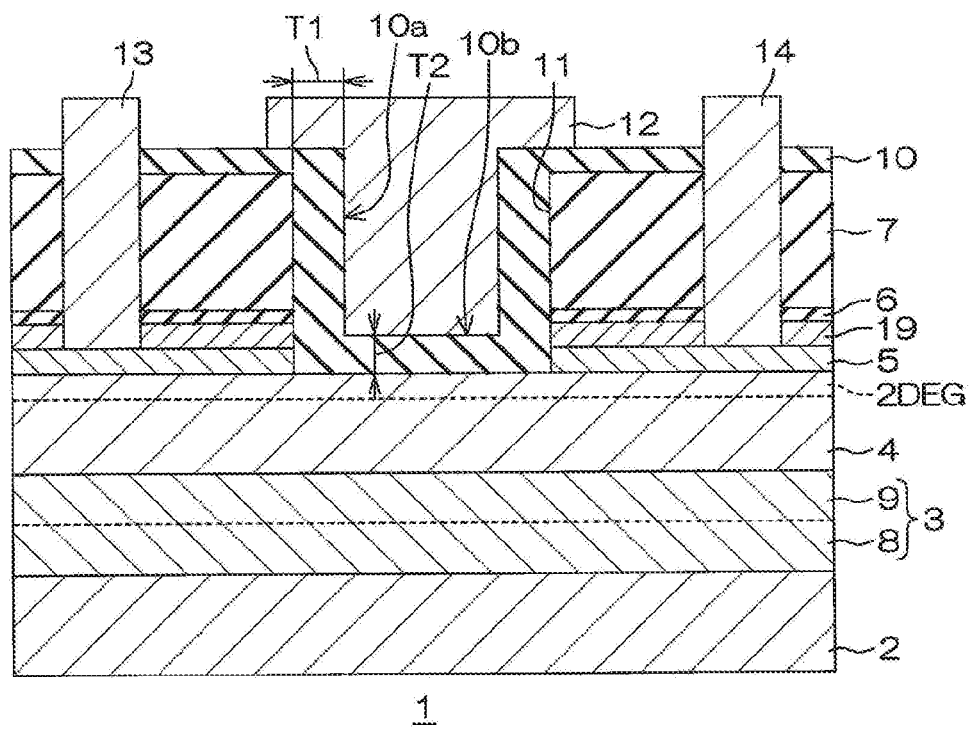
FIG. 17 is a sectional view showing a modification of the nitride semiconductor device shown in FIG. 6.

In addition, although it has been illustrated in the first embodiment that the passivation film 6 is formed on the electron supply layer 5, this configuration may be modified as shown in FIG. 17. FIG. 17 is a sectional view showing a modification of the nitride semiconductor device 1 shown in FIG. 6. In FIG. 17, the same elements as FIG. 6 are denoted by the same reference numerals and explanation of which will not be repeated. As shown in FIG. 17, the nitride semiconductor device 1 according to this modification further includes a cap layer 19 interposed between the electron supply layer 5 and the passivation film 6. The cap layer 19 is made of GaN and is formed to be coherent to the electron supply layer 5. A thickness of the cap layer 19 is, e.g., between 2 μm and 3 μm. A surface of the cap layer 19 in the opposite side to the substrate 2 is formed to be flat. The cap layer 19 with the flat surface can help to increase the electron mobility in the electron supply layer 5, which can result in a high switching response speed.

In addition, in this embodiment, the trench 11 penetrates through the cap layer 19 in addition to the spacer layer 7, the passivation film 6 and the electron supply layer 5. In addition, the source electrode 13 and the drain electrode 14 are both formed in ohmic contact with the electron supply layer 5 through the cap layer 19 in addition to the gate insulating film 10, the spacer layer 7 and the passivation film 6. If the source electrode 13 and the drain electrode 14 are formed by diffusion of Al, Al of the source electrode 13 and the drain electrode 14 may be diffused into the electron supply layer 5.

Figure 18:
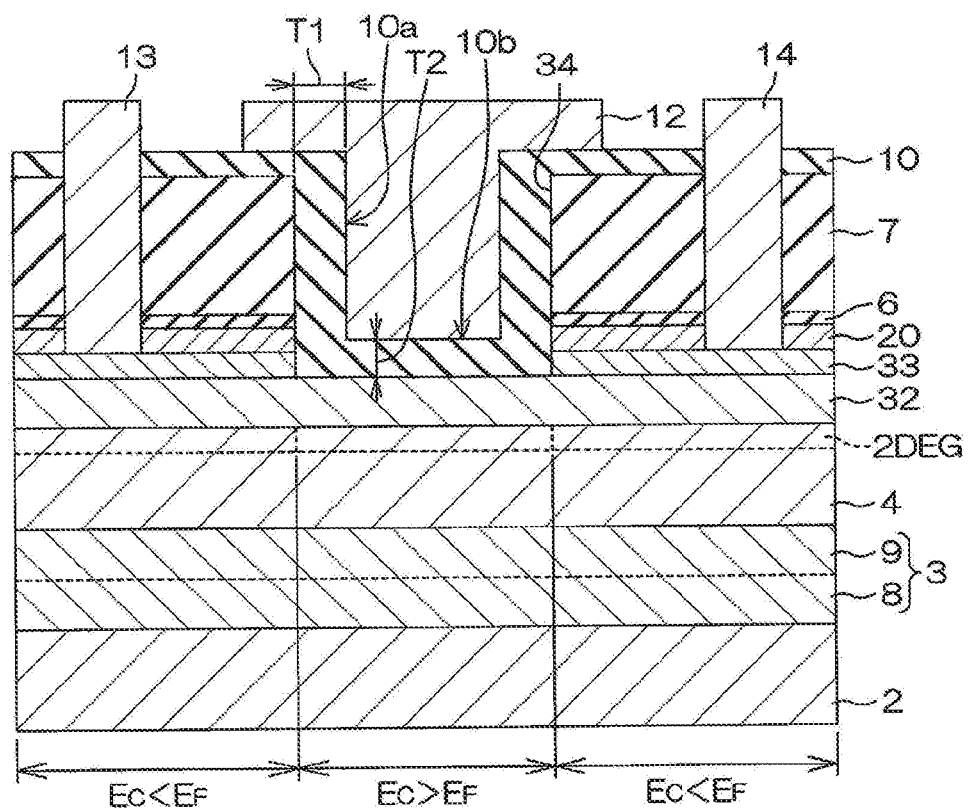
FIG. 18 is a sectional view showing a modification of the nitride semiconductor device shown in FIG. 11.

The configuration of interposition of the cap layer 19 between the electron supply layer 5 and the passivation film 6 may be applied to the nitride semiconductor device 21 (see FIG. 9) according to the above second embodiment and the nitride semiconductor device 22 (see FIG. 10) according to the above third embodiment. In addition, although it has been illustrated in the fourth embodiment that the passivation film 6 is formed on the second electron supply layer 33, this configuration may be modified as shown in FIG. 18. FIG. 18 is a sectional view showing a modification of the nitride semiconductor device 31 shown in FIG. 11. In FIG. 18, the same elements as FIG. 11 are denoted by the same reference numerals and explanation of which will not be repeated.

As shown in FIG. 18, the nitride semiconductor device 31 according to this modification further includes a cap layer 20 interposed between the second electron supply layer 33 and the passivation film 6. The cap layer 20 is made of GaN and is formed to be coherent to the second electron supply layer 33. A thickness of the cap layer 20 is, e.g., equal to or more than 2 μm and equal to or less than 3 μm. A surface of the cap layer 20 in the opposite side to the substrate 2 is formed to be flat. The cap layer 20 with the flat surface can help to increase the electron mobility in the first and second electron supply layers 32 and 33, which can result in a high switching response speed.

In addition, in this modification, the trench 34 penetrates through the cap layer 20 in addition to the spacer layer 7, the passivation film 6 and the second electron supply layer 33. In addition, the source electrode 13 and the drain electrode 14 are both formed in ohmic contact with the second electron supply layer 33 through the cap layer 20 in addition to the gate insulating film 10, the spacer layer 7 and the passivation film 6. If the source electrode 13 and the drain electrode 14 are formed by diffusion of Al, Al of the source electrode 13 and the drain electrode 14 may be diffused into the second electron supply layer 33.

The configuration of interposition of the cap layer 20 between the second electron supply layer 33 and the passivation film 6 may be applied to the nitride semiconductor device 41 (see FIG. 13) according to the above fifth embodiment and the nitride semiconductor device 42 (see FIG. 14) according to the above sixth embodiment. In addition, although it has been illustrated in the first to sixth embodiments that the spacer layer is formed, the spacer layer may not be formed.

Others, a variety of changes in design may be made within the scope of the present disclosure defined in the appended claims.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride semiconductor device comprising:
    an electron transit layer including $Ga_xIn_{1-x}N$ (0<x≤1);
    an electron supply layer formed over the electron transit layer and including $Al_aGa_bIn_cN$ (0≤a≤1, 0≤b≤1, 0≤c≤1 and a+b+c=1);
    a gate insulating film formed to penetrate into the electron supply layer over the electron transit layer; and
    a gate electrode disposed at least partially in the gate insulating film,
    wherein the electron transit layer and the electron supply layer form 2DEG (Two Dimensional Electron Gas),
    wherein the gate insulating film includes:
        a first portion extending along a vertical direction and contacting the gate electrode in a lateral direction; and
        a second portion extending along the lateral direction and contacting the gate electrode in the vertical direction, and
    wherein a thickness of the first portion is greater than a thickness of the second portion in the vertical direction.

2. The nitride semiconductor device of claim 1, further comprising a passivation film disposed over the electron supply layer,
    wherein the thickness of the first portion is greater than a sum of a thickness of the electron supply layer and a thickness of the passivation film.

3. The nitride semiconductor device of claim 2, further comprising a cap layer disposed between the electron supply layer and the passivation film.

4. The nitride semiconductor device of claim 3, wherein the gate insulating film is formed to penetrate through the cap layer.

5. The nitride semiconductor device of claim 1, further comprising a nonconductive spacer layer formed over the electron supply layer,
    wherein a trench is formed to expose the electron transit layer through the spacer layer and the electron supply layer.

6. The nitride semiconductor device of claim 1, wherein the gate insulating film includes AlON.

7. The nitride semiconductor device of claim 1, wherein the gate insulating film is formed to have a thickness so that an electric field in the gate insulating film is equal to or less than 10 MV/cm.

8. The nitride semiconductor device of claim 1, wherein, in the electron transit layer, a portion contacting the gate insulating film and a portion contacting the electron transit layer are flush with each other.

* * * * *